(12) United States Patent
Azuma et al.

(10) Patent No.: US 8,422,235 B2
(45) Date of Patent: Apr. 16, 2013

(54) SEMICONDUCTOR DEVICE, AND POWER CONVERSION DEVICE USING SEMICONDUCTOR DEVICE

(75) Inventors: Katsunori Azuma, Hitachi (JP); Mutsuhiro Mori, Mito (JP); Kinya Nakatsu, Hitachinaka (JP); Seiichi Hayakawa, Hitachi (JP); Fusanori Nishikimi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 282 days.

(21) Appl. No.: 12/920,287

(22) PCT Filed: Jul. 30, 2009

(86) PCT No.: PCT/JP2009/063597
§ 371 (c)(1),
(2), (4) Date: Nov. 16, 2010

(87) PCT Pub. No.: WO2010/016426
PCT Pub. Date: Feb. 11, 2010

(65) Prior Publication Data
US 2011/0051371 A1    Mar. 3, 2011

(30) Foreign Application Priority Data
Aug. 6, 2008 (JP) ................................. 2008-202603

(51) Int. Cl.
*H05K 1/14* (2006.01)
(52) U.S. Cl.
USPC ........... 361/736; 361/688; 361/699; 363/123; 363/127; 363/140; 363/141; 363/144

(58) Field of Classification Search .................. 361/689, 361/699, 736; 363/123, 127, 140, 141, 144
See application file for complete search history.

(56) References Cited

U.S. PATENT DOCUMENTS 6,166,937 A * 12/2000 Yamamura et al. ........... 363/141
6,414,867 B2 * 7/2002 Suzuki et al. .................. 363/141
(Continued)

FOREIGN PATENT DOCUMENTS

| JP | 8-149795 A | | 6/1996 |
| JP | 08149795 A | * | 6/1996 |

(Continued)

OTHER PUBLICATIONS

Japanese Office Action dated Jan. 10, 2012 including English-language translation (Seven (7) pages).

(Continued)

*Primary Examiner* — Hung S Bui
*Assistant Examiner* — James Wu
(74) *Attorney, Agent, or Firm* — Crowell & Moring LLP

(57) ABSTRACT

The present invention provides a vehicle power module and a power converter including a power semiconductor element (328), a plurality of connecting conductors (371U, 372U, 373U) for transmitting current to the power semiconductor element (328), and a metallic base (304) upon which the power semiconductor element (328) and the plurality of connecting conductors (371U, 372U, and 373U) are mounted; and the power semiconductor element (328) and the plurality of connecting conductors (371U, 372U, and 373U) are mounted upon the metallic base (304) so as to form a looped current path. Desirably, the power semiconductor element (328) and the plurality of connecting conductors (371U, 372U, 373U) are arranged so as to form two or more looped current paths.

2 Claims, 20 Drawing Sheets

U.S. PATENT DOCUMENTS

| | | | |
|---|---|---|---|
| 6,501,662 B2 * | 12/2002 | Ikeda | 361/760 |
| 6,843,335 B2 * | 1/2005 | Shirakawa et al. | 180/65.1 |
| 2003/0031038 A1 * | 2/2003 | Shirakawa et al. | 363/144 |
| 2007/0109715 A1 * | 5/2007 | Azuma et al. | 361/299.3 |
| 2008/0049476 A1 * | 2/2008 | Azuma et al. | 363/131 |
| 2008/0112201 A1 * | 5/2008 | Yahata et al. | 363/131 |
| 2008/0130223 A1 * | 6/2008 | Nakamura et al. | 361/689 |
| 2010/0097765 A1 * | 4/2010 | Suzuki et al. | 361/699 |
| 2010/0188814 A1 | 7/2010 | Nakatsu et al. | |

FOREIGN PATENT DOCUMENTS

| | | |
|---|---|---|
| JP | 2002-34268 A | 1/2002 |
| JP | 2005-12940 A | 1/2005 |
| JP | 2007-82359 A | 3/2007 |
| JP | 2007-143272 A | 6/2007 |
| JP | 2007-195292 A | 8/2007 |
| JP | 2008-29117 A | 2/2008 |

OTHER PUBLICATIONS

International Search Report including English translation dated Nov. 2, 2009 (Four (4) pages).

* cited by examiner (a)　　　(b)

(a)　　　(b)

WAVEFORMS AT THE TIME OF TURNING ON

SEMICONDUCTOR DEVICE, AND POWER CONVERSION DEVICE USING SEMICONDUCTOR DEVICE

TECHNICAL FIELD

The present invention relates to a semiconductor device that converts DC power into AC power, or converts AC power into DC power, and to a power conversion device that utilizes such a semiconductor device.

BACKGROUND ART

A power conversion device has the function of converting DC power supplied from a DC power supply into AC power for supply to an AC electrical load such as a rotating electrical machine or the like, or the function of converting AC power generated by a rotating electrical machine into DC power for supply to a DC power source. In order for it to have this type of power conversion function, such a power conversion device includes an inverter circuit incorporating semiconductor devices that have a switching function. The inverter circuit performs power conversion from DC power to AC power, or from AC power to DC power, by these semiconductor devices repeatedly operating to go continuous and to go discontinuous.

Since current is intercepted by this switching operation, spike voltages are generated due to the parasitic inductance present in the circuitry. In order to reduce such spike voltages, along with providing a smoothing capacitor, it is desirable to reduce the inductance of the DC electrical circuit. A technique of keeping down the spike voltages by reducing the inductance is described in Patent Document #1 (Japanese Laid-Open Patent Publication 2002-034268). According to Patent Document #1, the inductance is reduced by shortening the length of the wiring between the smoothing capacitor and the switching elements, so that it is possible to reduce the surge voltage.

A power conversion device that is mounted to a vehicle receives DC power from an in-vehicle power supply, and this DC power is, for example, converted into three phase AC power for supply to a rotating electrical machine for driving the vehicle. The demand upon the rotating electrical machine for driving the vehicle for generation of torque is nowadays becoming large as compared to previous requirements. Due to this, there is also a tendency for the power converted by the power conversion device to become great. Furthermore, a power conversion device that is mounted to a vehicle is used in a high temperature environment as compared with a power conversion device for use with a typical industrial machine. Due to this, with a power conversion device for a vehicle, it is even more desirable to reduce as much as possible the amount of heat generated by the power conversion device itself, as compared to the situation with a typical power conversion device. Since the heat generated by the switching elements included in the inverter circuit constitutes a large proportion of the heat generated by the power conversion device itself, accordingly it is desirable to reduce the amount of heat generated by the switching elements as much as possible.

Since the amount of heat generated increases when the switching elements change over from the non-continuous state to the continuous state, or from the continuous state to the non-continuous state, accordingly it is desirable to reduce the amount of heat generated during the above described changeover operation. In order to reduce this amount of heat generated, a first measure is to shorten the time period for changeover operation of the switching elements. Furthermore, a second countermeasure is to lengthen the interval at which the switching operation of the switching elements is performed, in other words to reduce the overall amount of heat generated by reducing the number of switching operations of the switching elements per unit time. However, with this second countermeasure, there is a limitation on greatly reducing the number of switching operations of the switching elements per unit time, because very large lengthening the interval for switching operation of the switching elements may entail a possibility of reducing the control accuracy.

And, in Patent Document #2 (Japanese Laid-Open Patent Publication 2007-143272), there is disclosed a technique for shortening the time period required for a switching element of an inverter circuit to change over by arranging reduction of the inductance, thus reducing the amount of heat generated per one cycle of switching operation by the switching element.

Patent Document #1: Japanese Laid-Open Patent Publication 2002-034268.

Patent Document #2: Japanese Laid-Open Patent Publication 2007-143272.

DISCLOSURE OF THE INVENTION

Problems to be Solved by the Invention

Recently it has been hoped not to stop only at the details disclosed in Patent Document #1, but to realize yet further improvements in reduction of the inductance and so on.

A technique for implementing reduction of the inductance, and the fact that reduction of the inductance is linked to reduction of the amount of heat generated per one operation of the switching element, are described in Patent Document #2. However with a power conversion device, and in particular with a power conversion device for use in a vehicle, the internal space available in the vehicle is restricted, and, along with reducing the amount of heat generated, it is also desirable to make the power conversion device more compact.

According to increase of the amount of power converted by a power conversion device, the device has a tendency to increase in size, and it is desirable to keep down increase of the volume of the device, even though the amount of power increases. For example, it is desirable to devise some way of increasing the maximum value of the power that can be converted per unit volume of the power conversion device. Due to this, it is desirable for implementation of reduction of the inductance and more compact manufacture of the device to be made compatible. Here, making the device more compact implies making the value of the maximum power that can be converted per unit volume of the power conversion device as large as possible. Furthermore, by reducing the amount of heat generated by the switching elements by implementing inductance reduction, by reducing the amount of usage of the switching elements, and by making the device more compact and lower in cost, it is possible to make the power conversion device more generally usable and to attain progress in reduction of the energy consumption, and thus it is possible to protect the environment.

The present invention provides a semiconductor device for reducing the inductance of a power conversion device and also for making it more compact.

And the present invention provides a power conversion device in which the semiconductor device described above is employed, and in which inductance reduction and downsizing are achieved.

Means for Solving the Problems

The vehicle power module according to the present invention includes: an upper arm circuit portion in which a plurality of power semiconductor elements are connected in parallel; a lower arm circuit portion in which a plurality of power semiconductor elements, different from those of the upper arm circuit portion, are connected in parallel, and moreover that is connected in series with the upper arm circuit portion; an insulating board upon which at least the upper arm circuit portion is implemented; and a metallic base joined to the side of the insulating board opposite to its side upon which the upper arm circuit portion is implemented; wherein the upper arm circuit portion comprises: a first connecting conductor for electrically connecting together a positive electrode terminal of DC power supply side and a collector terminal of a power semiconductor element of the upper arm circuit portion; and a second connecting conductor for electrically connecting together an emitter terminal of a power semiconductor element of the upper arm circuit portion and a collector terminal of a power semiconductor element of the lower arm circuit portion; and wherein power semiconductor elements of the upper arm circuit portion, the first connecting conductor, and the second connecting conductor are arranged upon the insulating board so that two or more looped current paths are formed upon the metallic base by currents that flow when the power semiconductor elements are switched.

It should be understood that it would also be acceptable to provide the first connecting conductor and the second connecting conductor as circuit wiring patterns formed upon the insulating board.

Moreover, it would also be acceptable to arrange: for the first connecting conductor to have an input end portion at which current is inputted from a DC power supply; for a plurality of the second connecting conductors to be provided, and moreover for each of the second connecting conductors to have an output end portion for outputting the current from the upper arm circuit portion; and for the current that is inputted from the input end portion to be branched within the upper arm circuit, and for the branched currents to be supplied to each of the plurality of output end portions.

In this case, it is desirable for a plurality of the output end portions to be arranged to sandwich the input end portion between them. Moreover, it would also be acceptable to arrange for the plurality of the output end portions to be arranged to sandwich the input end portion between them, and moreover to be arranged along one edge of the upper arm circuit; and, furthermore, for a power semiconductor element of the upper arm circuit to be arranged close to the other edge of the upper arm circuit, opposite to that one edge thereof.

Furthermore, it would also be acceptable to arrange for the lower arm circuit portion to include: a third connecting conductor for electrically connecting together an emitter terminal of a power semiconductor element of the lower arm circuit portion and a negative side of a DC power supply; and a fourth connecting conductor for electrically connecting together a collector terminal of a power semiconductor element of the lower arm circuit portion and an emitter terminal of a power semiconductor element of the upper arm circuit portion; with the power semiconductor elements of the lower arm circuit portion, the third connecting conductor, and the fourth connecting conductor being arranged upon the insulating board so that two or more looped current paths are formed upon the metallic base.

Even further, it would also be acceptable to arrange for the vehicle power module to have a rectangular shape; for the upper arm circuit portion and the lower arm circuit portion to be arranged along one edge of the vehicle power module; for the first connecting conductor and the second connecting conductor to be arranged close to the lower arm circuit portion; and for a power semiconductor element of the upper arm circuit portion to be arranged so as to be separated from the lower arm circuit portion via the first connecting conductor and the second connecting conductor.

In this case, it is desirable for the third connecting conductor and the fourth connecting conductor to be arranged close to the upper arm circuit portion; and for a power semiconductor element of the lower arm circuit portion to be arranged so as to be separated from the upper arm circuit portion via the third connecting conductor and the fourth connecting conductor.

And it would also be acceptable to arrange for there to be further included a DC terminal that is electrically connected to a positive electrode side of a DC power supply, and moreover that is for supply of current to the first connecting conductor; and for the DC terminal to be arranged between the upper arm circuit portion and the lower arm circuit portion.

Yet further, it would also be acceptable to arrange for the vehicle power module to have a rectangular shape; 3 sets of upper and lower arm circuits in which upper arm circuit portions and lower arm circuit portions are connected in series, each for outputting AC current a U phase, a V phase, and a W phase; and for the upper arm circuit portions and the lower arm circuit portions to be arranged along one edge of the vehicle power module, and moreover, taking an upper arm circuit portion and a lower arm circuit portion that constitute each phase as one set, for three sets of upper and lower arm circuit portions to be arranged in order of the U phase, the V phase, and the W phase along another edge that extends in an approximately vertical direction to the one edge.

In this case, it is desirable for the length of the other edge of the vehicle power module to be shorter than that of the one edge. Moreover, it would also be acceptable to arrange for there to be further included a plurality of upper arm control terminals for connection to gate electrodes of power semiconductor elements that are implemented in the upper arm circuit portions for each phase; and for the plurality of upper arm control terminals to be arranged along the other edge of the vehicle power module, and moreover near to approximate center of the other edge.

A first aspect of the vehicle power conversion device according to the present invention is a vehicle power conversion device including a vehicle power module according to the present invention, wherein the vehicle power module converts DC power supplied from a DC battery into AC power, and moreover the AC power is outputted to a motor for driving the vehicle.

It should be understood that it would also be acceptable to arrange for two of the vehicle power modules to be provided, and for these two vehicle power modules to output their AC power to different motors.

A second aspect of the vehicle power conversion device according to the present invention is a vehicle power conversion device including a vehicle power module as described above, wherein the vehicle power module converts DC power supplied from a DC battery into AC power and outputs that AC power to a motor for driving the vehicle, and further including: a smoothing capacitor module for smoothing the DC power; a wide laminated conductor plate that is electrically connected to the vehicle power module and to the smoothing capacitor module; a casing in which the vehicle power module and the smoothing capacitor module are housed; and a flow path forming portion, formed in the casing, for conducting a cooling medium; with the vehicle power module being disposed at one side of the flow path forming portion, and the smoothing capacitor module being disposed at the other side of the flow path forming portion, so that they sandwich the flow path forming portion between them.

It should be understood that it would also be acceptable to arrange for the wide laminated conductor plate to be electrically connected to the vehicle power module and to the smoothing capacitor module via a side portion of the flow path forming portion.

A third aspect of the vehicle power conversion device according to the present invention is a vehicle power conversion device comprising a vehicle power module as described above, wherein the vehicle power module converts DC power supplied from a DC battery into AC power and outputs that AC power to a vehicle driving motor, and further including: a smoothing capacitor module for smoothing the DC power; and a flat plate shaped positive electrode conductor plate that is connected to a positive electrode side of the vehicle power module and of the smoothing capacitor module, a flat plate shaped negative electrode conductor plate that is connected to a negative electrode side of the vehicle power module and of the smoothing capacitor module, and a laminated conductor plate including an insulating sheet that is laminated between the positive electrode conductor plate and the negative electrode conductor plate; with the laminated conductor plate being disposed upon the upper surface of the vehicle power module so as to cover the upper arm circuit or the lower arm circuit, and moreover being connected to the DC terminal.

It should be understood that it would also be acceptable to arrange for two of the vehicle power modules to be provided; and for the laminated conductor plate to be connected to the DC terminal of each of the two vehicle power modules.

A fourth aspect of the vehicle power conversion device according to the present invention is a vehicle power conversion device including a vehicle power conversion module as described above, wherein the vehicle power module converts DC power supplied from a DC battery into AC power and outputs the AC power to the vehicle driving motor, and further including: a flow path forming portion for conducting a cooling medium, formed in an approximate letter-U shape and having a going path and a return path; and a casing in which the vehicle power module and the flow path forming portion are stored; and wherein the going path of the flow path forming portion body is formed underneath a power semiconductor element of the upper arm circuit portion or a power semiconductor element of the lower arm circuit portion, and moreover a return path of the flow path forming portion is formed underneath a power semiconductor element of the upper arm circuit portion or a power semiconductor element of the lower arm circuit portion.

It should be understood that it would also be acceptable to arrange for the flow path forming portion to have an opening portion; and for a metallic base of the vehicle power module to be attached to the flow path forming portion so as to block the opening portion.

Furthermore, it would also be acceptable to arrange for the metallic base to be molded with a fin which projects into the going path and the return path of the flow path formation body from the opening portion of the flow path formation body.

The semiconductor device according to the present invention is a semiconductor device that uses at least a single power semiconductor element that, by switching, can either short circuit together or disconnect the electrical potentials at the two ends of the power semiconductor element, and including: a power semiconductor element of a thin plate shape equipped with electrodes on both sides; an insulating board upon one surface of which at least a first wiring pattern, a second wiring pattern, and a third wiring pattern are formed; and a metallic base that is adhered to the surface of the insulating board opposite to its surface upon which the wiring patterns are disposed; and wherein: an electrode of one side of the power semiconductor element is electrically connected upon the first wiring pattern of the insulating board, and an electrode of other side of the power semiconductor element is connected to a second wiring pattern and a third wiring pattern; the first wiring pattern is approximately shaped as a letter-T, and the second and third wiring patterns are disposed on both sides of the vertical bar of the approximate letter-T shape of the first wiring pattern; a first current path of the first wiring pattern, the power semiconductor element, and the second wiring pattern, and a second current path of the first wiring pattern, the power semiconductor element, and the third wiring pattern, constitute two current paths that turn around in letter-U shapes; and two eddy currents that are induced in the metallic base due to current flowing when the power semiconductor element is switched are created so as to eddy in mutually opposite directions.

It should be understood that it would also be acceptable to arrange for there to be further included a first circuit and a second circuit that include insulating boards bearing the wiring patterns; with the first circuit and the second circuit constituting a series circuit, and an electrical potential at both ends of the series circuit being outputted from a connection point between the first circuit and the second circuit due to switching of the power semiconductor element.

Advantageous Effects of the Invention

According to the present invention, it is possible to reduce the inductance of the semiconductor device, and moreover it is possible to prevent increase in the volume thereof.

Moreover, with a power conversion device that employs the semiconductor device described above as well, it is possible to anticipate reduction of the inductance, and also it is possible to suppress increase of the volume.

Furthermore, by implementing reduction of the inductance and thereby reducing the amount of heat generated by the switching elements, the amount of usage of the switching elements is reduced, and a device can be provided that is compact and low in cost.

BEST MODES FOR CARRYING OUT THE INVENTION

Figure 1:
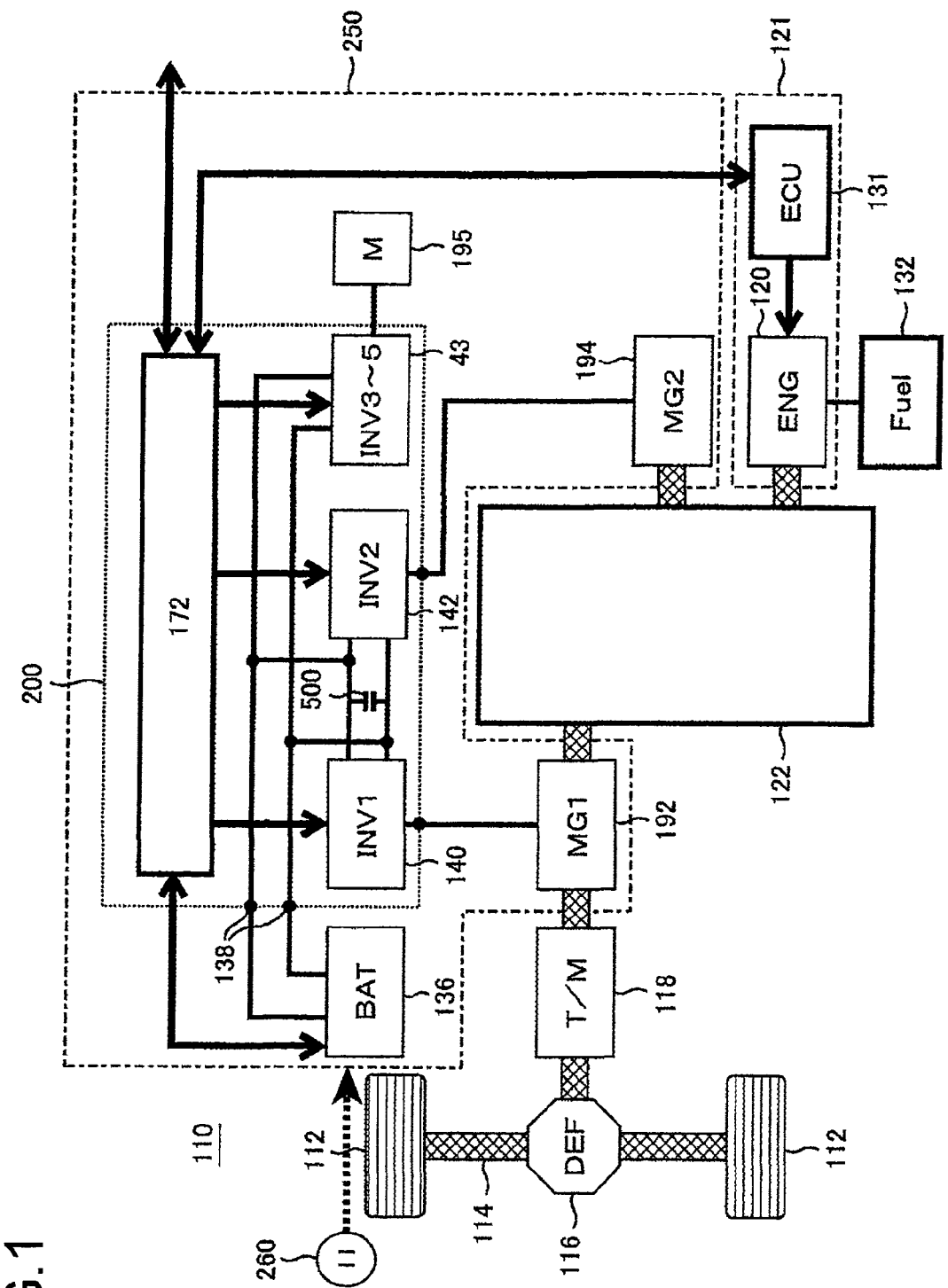
FIG. 1 is a block diagram of the energy transmission path of a hybrid automobile that employs a power conversion device 200 according to an embodiment.

In the embodiments explained below, apart from the advantageous effect of reduction of the inductance, and the advantageous effect of being able to suppress increase of the volume, various other advantageous effects are also obtained in product manufacture. These advantageous effects will be explained below.

Apart from the problems, the operation, and the advantageous effects described in the section "Problems to be Solved by the Invention", "Objects of the Invention" and in the section "Advantageous Effects of the Invention" as detailed above, since the embodiments of the present invention described below solve various problems directed to product improvement, and also yield various other beneficial effects, accordingly, before explaining the present invention with reference to the drawings, representative technical problems to be ameliorated and benefits to be obtained thereby, and an outline of a technique that provides the beneficial effect of solving these technical problems, will be explained.

<Explanation Relating to Reduction of the Inductance>

As schemes related to reducing the inductance of the electric circuit, there are the following three approaches. The first approach is to reduce the inductance of the power module. The second approach is to reduce the inductance of the capacitor module. The third approach is to reduce the inductance of the circuit that connects together the power module and the capacitor module. And the fourth approach is to reduce the inductance of the circuitry provided internally to the power module. It is most desirable to pursue all four of these approaches, from the first through the fourth. However, some beneficial effects may be reaped by pursuing even only one among these four approaches, although more desirable beneficial effects may be reaped by pursuing two among these four approaches.

Reduction of the inductance of the power module, that is the first approach, will now be explained. The power module contains the chips of the semiconductor element that is employed in the inverter circuit. The power module is provided with DC terminals for the transfer of DC power. A DC conductor from the DC terminals to the semiconductor element is built in a laminated construction by superimposing a conductor plate for the positive electrode side over a conductor plate for the negative electrode side with insulating material sandwiched between them. With this laminated construction, it is possible greatly to reduce the inductance of the electric circuit from the DC terminals to the semiconductor element. Moreover, lower inductance may be attained by planning the layout of the circuit board upon which the semiconductor chips are mounted.

Reduction of the inductance of the capacitor module, that is the second approach, will now be explained. The capacitor module has a structure in which a plurality of capacitor cells are arranged in parallel upon a laminated conductor that has a positive electrode conductor plate and a negative electrode conductor plate, and electrodes at the two ends of each of these capacitor cells are connected to the positive electrode conductor plate and the negative electrode conductor plate. With this construction, it is possible to reduce the internal inductance of the capacitor module. Moreover, in the embodiments described hereinafter, this laminated conductor that has the positive electrode conductor plate and the negative electrode conductor plate is formed with DC terminals for the capacitor module that project to the exterior from the capacitor module in an overlapped state. It is possible to reduce the inductance, since the terminals of the capacitor module are formed by extending the laminated construction of the internal conductor plates.

With regard to reduction of the inductance of the circuit that connects together the power module and the capacitor module, that is the third approach, this may be implemented by building this circuit as two conductors layered together with insulating material sandwiched between them, and by building the connection terminal configuration at the connection portion as overlapped.

Reduction of the inductance of the circuitry internal to the power module, that is the fourth approach, will now be explained. The switching elements that make up the circuitry within the power module are arranged so that the currents flowing during switching form a small loop on the metallic base plate upon which the switching elements are mounted. Due to this, an induced current is generated in the metallic base plate by the magnetic flux generated around the small loop current. The orientation of the magnetic flux generated around the induced current is opposite to the orientation of the magnetic flux created around the small loop current described above, so that the magnetic fluxes mutually cancel out one another. Due to this, it is possible to reduce the inductance of the circuitry within the power module.

<Explanation Related to Making the Power Conversion Device More Compact>

The following five approaches related to making the power conversion device more compact will now be explained. A first approach is to aim at making the power conversion device more compact by providing a cooling water flow path at the middle of the casing of the power conversion device, and to perform cooling by utilizing both sides of this cooling water flow path. A second approach is to aim at making the power conversion device more compact by providing a space for performing electrical connection between the power module and the capacitor module, between a side portion of the cooling water flow path and the casing. A third approach is to simplify the electric wiring by providing two power modules arranged side by side along the direction of flow of the cooling water in the cooling water flow path, so that it becomes possible to make the device more compact. A fourth approach is to improve the construction of the power module. And a fifth approach is to improve the construction of the capacitor module. Advantageous effects are available with each of the approaches described above, and moreover it is possible to obtain a yet greater advantageous effect by implementing a combination of these approaches.

The first approach will now be explained. A construction is employed in which a cooling water flow path is disposed at the middle of the casing of the power conversion device, and cooling is performed by utilizing both sides of this cooling water flow path. The cooling efficiency is enhanced by this construction, and this is connected to making the device more compact. Even further, in the embodiment described below, it is possible to arrange the power module on one side of the cooling water path and to arrange the capacitor module on the other side of the cooling water path, so that it is possible to reduce the volume required for the cooling construction for the power module and the capacitor module, and, as a result, it becomes possible to make the power conversion device more compact.

According to a further aspect of this scheme, it is planned to simplify the connection between the power module and the drive circuitry for driving the semiconductor elements internal to the power module, and to make the entire device more compact, by disposing the drive circuitry on the same side, relative to the position of the cooling water path, at which the power module is disposed.

According to a yet further aspect of this plan, it becomes possible to enhance the cooling efficiency by disposing the power module on one of the surfaces of the cooling water flow path, and by providing an inverter device for auxiliary machinery on the other surface of the cooling water flow path, and as a result it becomes possible to make the power conversion device more compact. Here, this inverter device for auxiliary machinery may be, for example, an inverter device for a motor for driving a vehicle air conditioner, or an inverter device for a motor for an oil pump or the like. Furthermore, by providing the inverter device for auxiliary machinery and the capacitor module on the other side of the cooling water path, in addition to using the capacitor module as a capacitor for smoothing the rotating electrical machine for driving the vehicle, it is also possible to use it as a smoothing capacitor for the inverter for auxiliary machinery. Accordingly, it becomes possible to make this power conversion device, of which the circuit structure has been simplified, more compact.

The second approach will now be explained. The cooling water flow path is formed along one edge of the casing that is formed in a roughly rectangular shape, and an aperture, in other words a pierced space, is provided between a side portion of this flow path and the casing and extending in the direction orthogonal to that one edge of the casing, so as to connect the space on one side of the cooling water flow path and the space on the other side thereof. This construction makes it possible, via this space, to electrically connect together electrical components that are provided on one side of the cooling water flow path, and electrical components that are provided on the other side of the cooling water flow path. The required electrical connections can be made via this pierced space, so that, along with it becoming possible to anticipate simplification of these connections, also it becomes possible to make the power conversion device more compact.

The third approach will now be explained. In the embodiment below, the cooling water flow path is formed extending along one side of the casing that is formed in a roughly rectangular shape, and two power modules are disposed in sequence along the direction of water flow along this cooling water flow path. Moreover, the DC side terminals and the AC side terminals of these two power modules are provided in the direction orthogonal to the flow of cooling water. According to this type of construction, it is possible to take advantage of the space between the cooling water flow path and the casing for disposing the terminals, so that it is possible to make the power conversion device more compact. Furthermore, since the terminals (i.e. the AC terminals 159 in FIG. 14) of the two power modules are arranged in sequence roughly parallel to the direction in which the two power modules are arranged in sequence, accordingly the possibility of mutual interference between them is low, and the path of the AC bus bars that are connected to the AC terminals becomes shorter, so that it becomes possible to make the device more compact.

Making the power module more compact will now be explained; this is the fourth approach. The two power modules that will be described hereinafter have similar structures. In each of these power modules, a series circuit consisting of an upper arm and a lower arm of the inverter circuit is provided to correspond to each of the U phase, the V phase, and the W phase of three phase AC. Since the above described series circuits are provided in parallel, accordingly it becomes possible to lay out the semiconductor chips of these series circuits systematically, and this leads to making the power module more compact.

Furthermore, in the embodiment described below, along with a construction being employed in which the semiconductor elements that make up the inverter circuit are fixed to a metallic plate for heat dissipation via an insulating layer, also the DC conductors for providing DC power to the power module are supplied from above the semiconductor elements. According to this construction, the power module itself becomes compact, and this leads to making the power conversion device more compact.

Improvements related to the capacitor module will now be explained; this is the fifth approach. The capacitor module has a construction in which a plurality of capacitor cells are provided in parallel upon a positive electrode conductor plate and a negative electrode conductor plate that are made in a laminated structure, and the positive and negative electrodes of these capacitor cells are connected to these positive electrode and negative electrode conductor plates. This capacitor module has a structure in which a plurality of such capacitor plates of laminated structure, to which such capacitor cells are fixed, are provided in parallel, and thereby it becomes possible to construct a capacitor module of large capacity in a comparatively compact shape. Moreover, this making of the capacitor module more compact leads to making the power conversion device more compact.

Even further by using, as the capacitor cells, film capacitors in which films and thin insulating members are wound together, and by fixing these film capacitors so that their outer circumferential surfaces oppose the surface of the conductor plate of laminated structure, along with it being possible to make the capacitor module itself more compact, it is also possible to make its structure stronger against vibration and so on, so that the reliability is enhanced.

Moreover, by adopting a construction in which the plurality of capacitor cells are lined up in the lengthwise direction along the side of the conductor plate, that is of laminated structure, and in which the electrodes of the capacitor cells are arranged in the widthwise direction of the conductor plate, connection together of the capacitor cells and the conductor plate becomes simple, and thus the productivity is enhanced.

With regard to problems that the present invention attempts to solve other that those described previously and advantageous effects other than the objects of the invention described above, along with such problems being solved by the embodiment explained below, various new advantageous effects are also obtained. In the following discussion, these new problems of which the solution is attempted are also explained.

<Enhancement of the Reliability>

In the embodiment described below, a space is defined pierced between the side portion of the cooling water path and the casing, so that connection between the power module and the capacitor module may be performed. Since this space is defined in a different position from that of the cooling water flow path, and connection is performed via this space, it is unlikely that any influence from the cooling water will be experienced, so that the reliability is enhanced.

<Enhancement of the Productivity>

Furthermore, the cooled portion of the casing has a space that surrounds the cooling water path so as to envelope it, this space having a shape that connects to the DC bus bars that connect the power module and the capacitor, outside the cooling water space for the cooling water passage that cools heat dissipation fins of the power module, and thereby it may be anticipated that the entire cooling structure of the power conversion device can be simplified and that it may be made more compact, and moreover that its ease of assembly will be enhanced. In addition it is also possible for the cooling water within the cooling water space to make a contribution to cooling the capacitor, via the portion of the casing that is cooled.

<Enhancement of the Cooling Efficiency>

The power conversion device according to this embodiment has a construction in which the series circuits of the upper and lower arms of the inverter device are stored internally to the power module (i.e. the semiconductor module) that has heat dissipation fins on its one side, the power module is inserted into the cooling portion, and the heat dissipation fins are directly cooled by the cooling water. Furthermore, it is possible to enhance the cooling efficiency by employing a laminated structure in which the cooling water path is enclosed between the power module and the capacitor for smoothing the DC power supply, in other words a sandwiched construction in which the cooling water path is sandwiched between the power module and the capacitor, and thus, by enhancing the cooling efficiency, it is possible to make the power conversion more compact.

Furthermore, along with the cooling water being passed into the cooling water flow path from a short side of the rectangular shaped casing, and the cooling water flow path being extended along a long side of the rectangular shaped casing, the shape of the return back is made to be also along the long side. The two power modules are arranged so as to be cooled one by the going cooling water flow path and the other by the returning flow path, and thereby the cooling efficiency is enhanced. And the cooling efficiency is further enhanced by the positions of the chips that make up the upper arm inverter circuit and the positions of the chips that make up the lower arm inverter circuit being made to be positions that correspond to the going and returning cooling water flow paths, respectively. This enhancement of the cooling efficiency exercises a beneficial influence both for enhancement of the reliability and for making the device more compact. The above explanation is a summary of the advantageous effects obtained by an embodiment of the present invention, and of the problems that it solves.

Next, a power conversion device according to an embodiment of the present invention will be explained with reference to the drawings. As a representative example of a power conversion device according to an embodiment of the present invention, a vehicle power conversion device that is applied to a hybrid automobile will be explained.

It should be understood that, while the structure of this embodiment is optimum as a power conversion device for driving a vehicle such as an automobile or a truck or the like, it may also be applied to a power conversion device of some other type, such as, for example, a power conversion device for a train or a ship or an aircraft or the like, a power conversion device for industry that is used as a control device for an electric motor that drives a facility in a workplace, or a power conversion device for household use that is used in a control device for driving a household solar power generating system or an electrical product.

Figure 2:
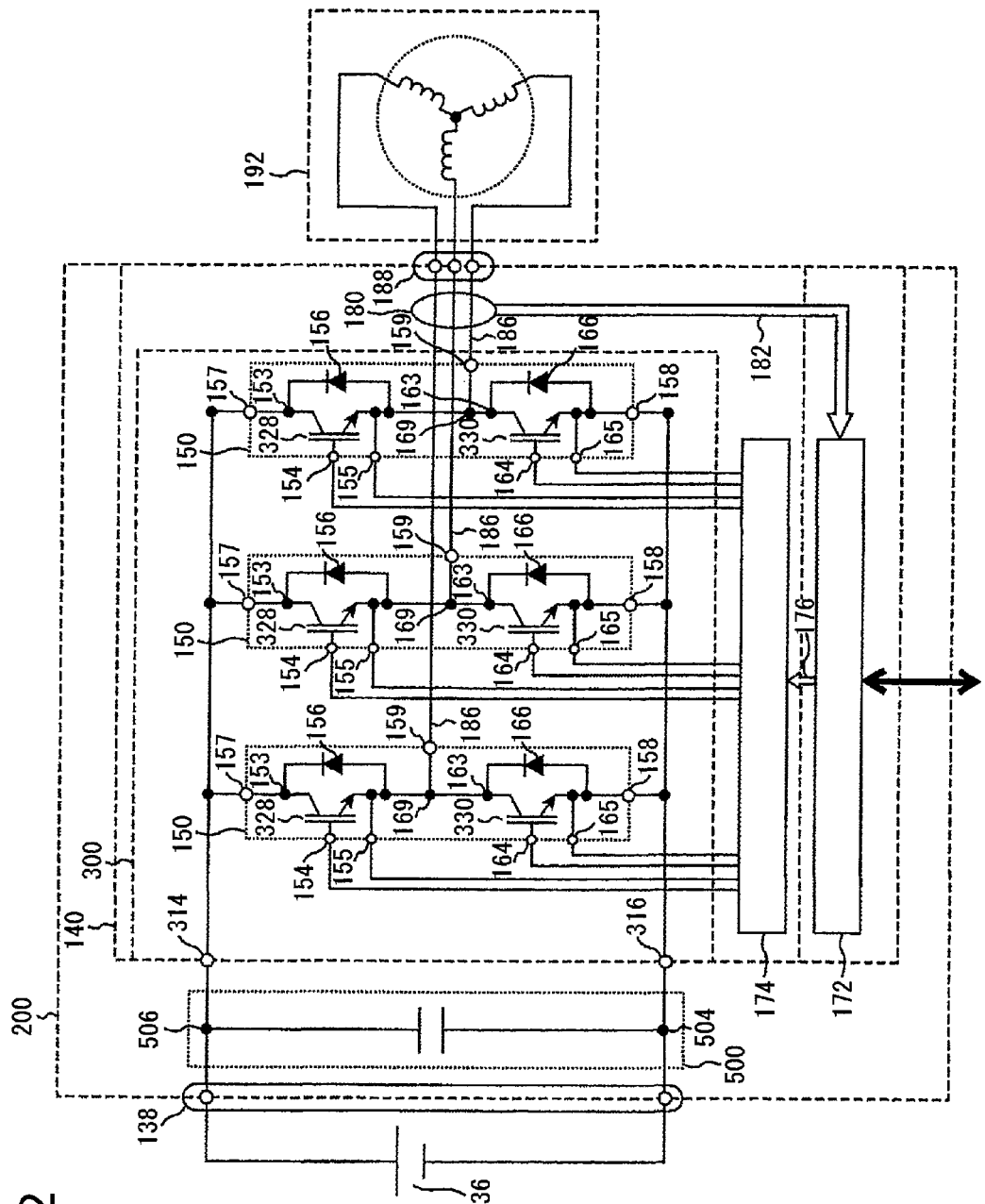
FIG. 2 is a structural circuit diagram of the power conversion device 200 according to this embodiment.

FIG. 1 is a block diagram showing the energy transmission path of a hybrid automobile that employs a power conversion device according to this embodiment. And FIG. 2 is a structural circuit diagram of the power conversion device according to this embodiment.

For a power conversion device (i.e. an inverter) for a vehicle according to this embodiment of the present invention, the mounting environment and the operational environment are severe. An inverter device for driving a vehicle is a control device that controls the electric motor that drives the vehicle, and it converts DC power supplied from an in-vehicle battery or an in-vehicle electricity generation device that constitutes an in-vehicle power supply into AC power of a predetermined type, and thereby controls the driving of the electric motor. Moreover, this electric motor also has the function of acting as a generator, and the inverter device for driving the vehicle also has the function of converting AC power generated according to a deceleration operational mode or the like into DC power. This DC power that has thus been converted is used by being stored in an in-vehicle battery, or is supplied to another inverter for driving that drives an electric motor.

The hybrid electric automobile 110 of FIG. 1 (referred to in the following as a "HEV") is provided with two vehicle power systems. One of these is an engine system 121 that employs a fossil fuel or hydrogen or the like as an energy source, and that employs an engine 120 that is an internal combustion engine as a power source. Apart from driving the vehicle with the engine 120 using fuel 132, the engine system 121 transmits power to a motor-generator 194 via a power division mechanism 122. The other power system is a vehicle electrical system 250 to that the electrical energy of a battery is supplied, and that constitutes a power source for the motor-generators 192 and 194. These two systems mutually exchange information such as engine rotational speed, torque commands, and so on. For example, a portion of the power of the engine 120 is used by the motor-generator 194 via the power division mechanism 122 for electricity generation, and is converted into electrical energy. This electrical energy is used for charging the battery 136, or for driving one of the motor-generators 192. The motor-generators 192 and 194 are synchronous machines or induction machines, and here they will be termed "motor generators", since they can function as motors or as generators, according to the mode in which they are operated.

Front wheel axles 114 are rotatably supported at the front portion of the vehicle body. A pair of front wheels 112 are provided at the ends of the two front wheel axles 114. And a rear wheel axle (not shown in the figure) is rotatably supported at the rear portion of the vehicle body. A pair of rear wheels are provided at the two ends of this rear wheel axle. With the HEV of this embodiment, it is supposed that the main wheels that are driven by power are the front wheels 112, while the auxiliary wheels that are carried along freely are the rear wheels, so that the so called front wheel drive format is employed; but the rear wheel drive format could also be employed.

A front wheel side differential gear (hereinafter referred to as the front wheel side DEF) 116 is provided at the central portion between the front wheel axles 114. The front wheel axles 114 are mechanically connected to the output side of this front wheel side DEF 116. And the output shaft of a speed change mechanism 118 is mechanically connected to the input side of the front wheel side DEF 116. The front wheel side DEF 116 is a differential type power division mechanism that divides the rotational drive force transmitted and speed changed by the speed change mechanism 118 between the front wheel axles 114. The output side of the motor-generator 192 is mechanically connected to the input side of the speed change mechanism 118. And the output side of the engine 120 and the output side of the motor-generator 194 are mechanically connected to the input side of the motor-generator 192, via the power division mechanism 122. It should be understood that the motor-generators 192 and 194 and the power division mechanism 122 are housed in the interior of the casing of the speed change mechanism 118.

In this embodiment, the motor-generators 192 and 194 are synchronous machines having permanent magnets in their rotors. The driving of these motor-generators 192 and 194 is controlled by the AC power supplied to the armature windings of their stators being controlled by inverter devices 140 and 142. These inverter devices 140 and 142 are electrically connected to the battery 136, and thus it is possible for power to be mutually transferred between the battery 136 and the inverter devices 140 and 142.

The inverter devices 140 and 142 control the phase, the frequency, and the power of the AC supplied to the motor-generators 192 and 194. For example, due to AC power being supplied that has a phase that leads with respect to the rotation of the rotors of the motor-generators 192 and 194, the motor-generators 192 and 194 generate torque. On the other hand, the motor-generators 192 and 194 are operated as generators by AC power of delayed phase being generated, and in this case the motor-generators 192 and 194 are operated in the regenerative braking state.

In this embodiment, two power generation units are provided, i.e. a first electric drive and power generation unit that consists of the motor-generator 192 and the inverter device 140, and a second electric drive and power generation unit that consists of the motor-generator 194 and the inverter device 142, and usage is divided between these two units according to the operational situation. In other words, when the vehicle is being driven by power from the engine 120, if the drive torque of the vehicle is to be assisted, then the second electric drive and power generation unit is operated as an electrical power generation unit that generates electrical power from the power of the engine 120, and the first electric drive and power generation unit is operated as an electrical drive unit that employs the power obtained by this electricity generation. Furthermore, in a similar case, if the speed of the vehicle is to be assisted, then the first electric drive and power generation unit is operated as an electrical power generation unit that generates electrical power from the power of the engine 120, and the second electric drive and power generation unit is operated as an electrical drive unit that employs the power obtained by this electricity generation.

Furthermore, in this embodiment, it is possible to drive the vehicle only by the power of the motor-generator 192, by operating the first electric drive and power generation unit as an electrical power unit using the power of the battery 136. Yet further, in this embodiment, it is possible to charge up the battery 136 by operating the first electric drive and power generation unit or the second electric drive and power generation unit as an electrical power generation unit with the power or the engine 120 or with power from the vehicle wheels, so as to generate electricity.

The battery 136 is also used as a power supply for driving a motor 195 for auxiliary machinery. Such auxiliary machinery may, for example, be a motor that drives a compressor of an air conditioner, or a motor that drives an oil pressure pump for control. DC power is supplied from the battery 136 to an inverter device 43, and is converted by the inverter device 43 into AC power that is supplied to the motor 195. The inverter device 43 has functions similar to those of the inverter devices 140 and 142, and controls the phase, the frequency, and the power of the AC supplied to the motor 195. Since the capacity of the motor 195 is smaller than the capacities of the motor-generators 192 and 194, accordingly the maximum power that the inverter device 43 can convert is made to be smaller than that for the inverter devices 140 and 142. However, the circuit structure of the inverter device 43 is fundamentally the same as the circuit structures of the inverter devices 140 and 142.

The inverter devices 140, 142, and 43 convert DC power into AC power by switching. Since abrupt currents are produced by this switching, a capacitor module 50 is connected directly subsequently to the inverter devices. During this switching, these inverter devices and this capacitor module generate heat due to continuity losses (electrical resistance). Due to this, it is desirable to minimize this generation of heat and to enhance the cooling capability, in order to reduce the volume of the power conversion device and in order to keep the cost down. With the power conversion device 200 that will be described in detail hereinafter, it is possible to implement both reduction of losses and also enhancement of the cooling capability.

Moreover, by housing the inverter devices 140 and 142, the inverter device 43, and the capacitor module 500 within a single casing, it is possible to implement simplification of the wiring and also reduction of the noise.

It should be understood that while, in this embodiment, the combination of the engine system 121 and the vehicle electrical system 250 is explained for an HEV, the present invention could also be applied to an HEV in which a connection portion 260 to the exterior of the vehicle is provided so that it is possible to supply power from the exterior of the vehicle and charge up the battery 136 from the exterior, or to a vehicle in which the engine system 121 is eliminated and a connection portion is provided so that power can be supplied from the exterior of the vehicle to the vehicle electrical system 250.

Furthermore, the present invention could also be applied to a vehicle in which the engine system is eliminated, and the battery of the vehicle electrical system 250 is built as a fuel cell that directly converts into electricity fuel such as hydrogen or the like that is supplied from the exterior of the vehicle, or to a vehicle in which a battery that is charged and discharged is connected in parallel to such a fuel cell, and a connection portion is provided so that it is possible to supply power from the exterior of the vehicle to this battery that is charged and discharged.

FIG. 2 is a structural circuit diagram of the inverter device 140 in this power conversion device 200, shown as a representative example. The other inverter devices 142 and 143 have similar circuit structures.

As shown in FIG. 2, this inverter device 140 includes a power module 300 and a driver circuit 174: the driver circuit 174 is operated by a signal from the control circuit 172, thus performing switching of the IGBTs in the power module 300.

The driver circuit 174 is mounted within the inverter device 140, and moreover is disposed in the neighborhood of the power module 300 and above it. Since due to this it is possible to shorten the wiring of the signal lines between the inverter device 140 and the driver circuit 174, accordingly it is possible to prevent the switching frequency of the inverter device 140 from getting into these signal lines. And the switching frequency of the inverter device 140 is smaller than the frequency of the control signals transmitted from the driver circuit 174. Due to this, it is possible to avoid erroneous operation of the inverter device 140 and the driver circuit 174.

In this embodiment, the power module 300 includes upper arm IGBTs 328 (insulated gate bipolar transistors) and diodes 156 that switch at high electrical potential, and lower arm IGBTs 330 (insulated gate bipolar transistors) and diodes 166 that switch at low electrical potential. Furthermore, this power module 300 has three upper and lower arm series circuits 150 for a three phase AC (alternating current) motor. A point at the central portion of each of these upper and lower arm series circuits 150 (i.e. an intermediate electrode 169) is connected via an AC terminal 159 to an AC power line (i.e. an AC bus bar) 186 that leads to the motor-generator 192.

As shown in FIG. 2, the IGBTs 328 and 330 have collector electrodes 153 and 163, emitter electrodes (drive emitter terminals 155 and 165), and gate electrodes (gate electrode terminals 154 and 164). The IGBTs are switched by voltage being applied to their gate electrodes, and control the turning ON and OFF of currents in the direction from their collectors to their emitters. The diodes 156 and 166 are provided with two electrodes, i.e. a cathode electrode and an anode electrode, and allow currents to flow in the directions from their anodes to their cathodes. As shown in the figure, the cathode electrodes of the diodes are electrically connected to the collector electrodes of the IGBTs, while the anode electrodes of the diodes are electrically connected to the emitter electrodes of the IGBTs. Due to this, currents in the directions from the emitters to the collectors that cannot flow through the IGBTs are able to flow through the diodes instead. Here, this mode of connection of the diodes to the IGBTs will be termed inverse parallel connection. Due to this inverse parallel connection, even when the IGBTs are turned OFF, circuits are formed within the inverter by currents flowing through the diodes of the pairs of arms, so that the motor currents can flow interruption. If MOSFETs (metallic oxide semiconductor type field effect transistors) are used instead of IGBTs as the power switching semiconductor elements, then the diodes may be omitted, since such MOSFETS can conduct current in the reverse direction.

As shown in FIG. 2, the collector electrode 153 of each of the IGBTs 328 is electrically connected (with a DC bus bar) to the positive electrode of the capacitor module 500 via a positive electrode terminal 157 (i.e. a P terminal), while the emitter electrode of each of the lower arm IGBTs 330 is electrically connected to the negative electrode side of the capacitor module 500 via a negative electrode terminal 158 (i.e. an N terminal). And intermediate electrodes 169 at the central points between the arms (i.e. the portions where the emitter electrodes of the upper arm IGBTs 328 and the collector electrodes of the lower arm IGBTs are connected together) are connected via an AC connector 188 to the AC terminals of the motor-generator 192. With this circuit, when an upper arm IGBT 328 is ON, positive electrode potential is outputted from its intermediate electrode 169. Conversely, when a lower arm IGBT 330 is ON, negative electrode potential is outputted from its intermediate electrode 169. Due to this, positive electrode potential and negative electrode potential in pulse form are supplied to the AC terminals of the motor-generator, and an AC electrical potential is created according to the density of these pulses in the time intervals, so that an AC current flows to the motor-generator and drives it as a motor. Control of the power of the motor, in other words control of its torque, is performed by changing the density of these pulses in the time intervals. This is termed PWM control (Pulse Width Modulation control).

The capacitor module 500 shown in FIG. 2 is wired between the inverter device 140 and the battery 136, and is disposed as close as possible to the inverter device 140 within the power conversion device 200, in order to supply current instantaneously upon switching. Within the power conversion device 200, the capacitor module 500 is connected in parallel to the battery 136 between the DC terminals (a positive electrode terminal 314 and a negative electrode 316) of the inverter device 140 (i.e. of the power module 300) and a DC connector 138 to that an external cable that leads to the battery 136 is connected, so that the voltage of the battery 136 is smoothed.

The control circuit 172 shown in FIG. 2 includes a micro computer (hereinafter termed a "microcomputer") for performing processing to calculate the switching timings for the IGBTs 328 and 330. A target torque value requested for the motor-generator 192, the values of the currents supplied to the armature winding of the motor-generator 192, and the position of the magnetic poles of the rotor of the motor-generator 192 are supplied to this microcomputer as input information.

The target torque value is a value based upon a command signal outputted by a higher level microcomputer that performs hybrid control of the engine and the motors. This higher level microcomputer that performs hybrid control may be mounted to the control circuit 172, or may be mounted in a place provided separately within the vehicle. As shown in FIG. 1, in this embodiment, this higher level microcomputer is mounted to the control circuit 172, and exchanges signals with the engine controller 131 for the requested torque value and engine rotational speed and so on.

The current value is detected on the basis of a detection signal outputted from a current detection unit 180. This current detection unit 180 is provided between the AC connector 188 of the power conversion device 200 and the AC terminal of the power module 300, so that the connection wiring to the microcomputer board becomes short.

The magnetic pole position is detected on the basis of a detection signal outputted from a rotating magnetic pole sensor (not shown in the figures) provided to the motor-generator 192. While, in this embodiment, an example is presented and explained in which the currents of three phases are detected, it would also be acceptable to arrange to detect the currents of two phases.

The microcomputer that is mounted to the control circuit 172 shown in FIG. 2 calculates d and q axis current command values for the motor-generator 192 on the basis of the target torque value. Moreover, it calculates voltage command values for the d and q axes on the basis of the differences between these current command values for the d and q axes that have been calculated and the detected current values for the d and q axes, and converts these calculated voltage command values for the d and q axes into voltage command values for the U phase, the V phase, and the W phase on the basis of the detected magnetic pole position.

And the microcomputer generates modulated waves in pulse form on the basis of comparison between fundamental waves (sine waves) based upon the voltage command values for the U phase, the V phase, and the W phase, and carrier waves (triangular waves), and outputs these modulated waves that have been generated to the driver circuit 174 as PWM (pulse width modulated) signals.

When driving the lower arms, the driver circuit 174 shown in FIG. 2 amplifies these PWM signals, and outputs them to the gate electrodes of the lower arm IGBTs 330. On the other hand, when driving the upper arms, it amplifies the PWM signals after having shifted the level of the reference potential of those PWM signals to the level of the reference potential of the upper arms, and outputs these as drive signals to the respective gate electrodes of the corresponding upper arm IGBTs 328. Due to this, each of the IGBTs 328 and 330 performs switching operation on the basis of the drive signal that is inputted to it.

Apart from driving the IGBTs, the control circuit 172 and the driver circuit 174 shown in FIG. 2 also perform anomaly detection (for excess current, excess voltage, excess temperature and so on), so as to protect the upper and lower arm series circuits 150. For this, sensing information is inputted to the control unit 170. For example, when performing excess current detection, IGBTs that are equipped with emitter terminals for signaling excess current (not shown in the drawings) are used, these emitter terminals are connected by wiring to arm drive circuits (ICs) (also not shown in the drawings) within the driver circuit 174, and excess current detection is performed by these drive circuits (ICs).

Furthermore, when performing excess temperature detection, temperature information from temperature sensors (not shown in the drawings) that are provided to the upper and lower arm series circuits 150 is inputted to the driver circuit or to the microcomputer board.

Yet further, when performing excess voltage detection, the voltage at the DC positive electrodes of the upper and lower arm series circuits 150 are monitored and when excess current, excess temperature, or excess voltage has been detected, either operation of the corresponding IGBT or of all IGBTs are shut down, or control is performed to reduce the output of the motor, so that the IGBTs, the power conversion device, and the vehicle are all protected. At this time, the drive circuit (IC) controls the shutdown speed so that the IGBTs are not damaged by excess voltage. If excess temperature is detected, the protection operation is performed by shutdown of the IGBTs or by reducing the motor output.

The detailed external structural appearance of the power conversion device described above with reference to FIGS. 1 and 2 will now be explained in detail with reference to FIGS. 3 and 4. It should be understood that reference symbols that are the same as ones used in FIGS. 1 and 2 denote the same components.

Figure 3:
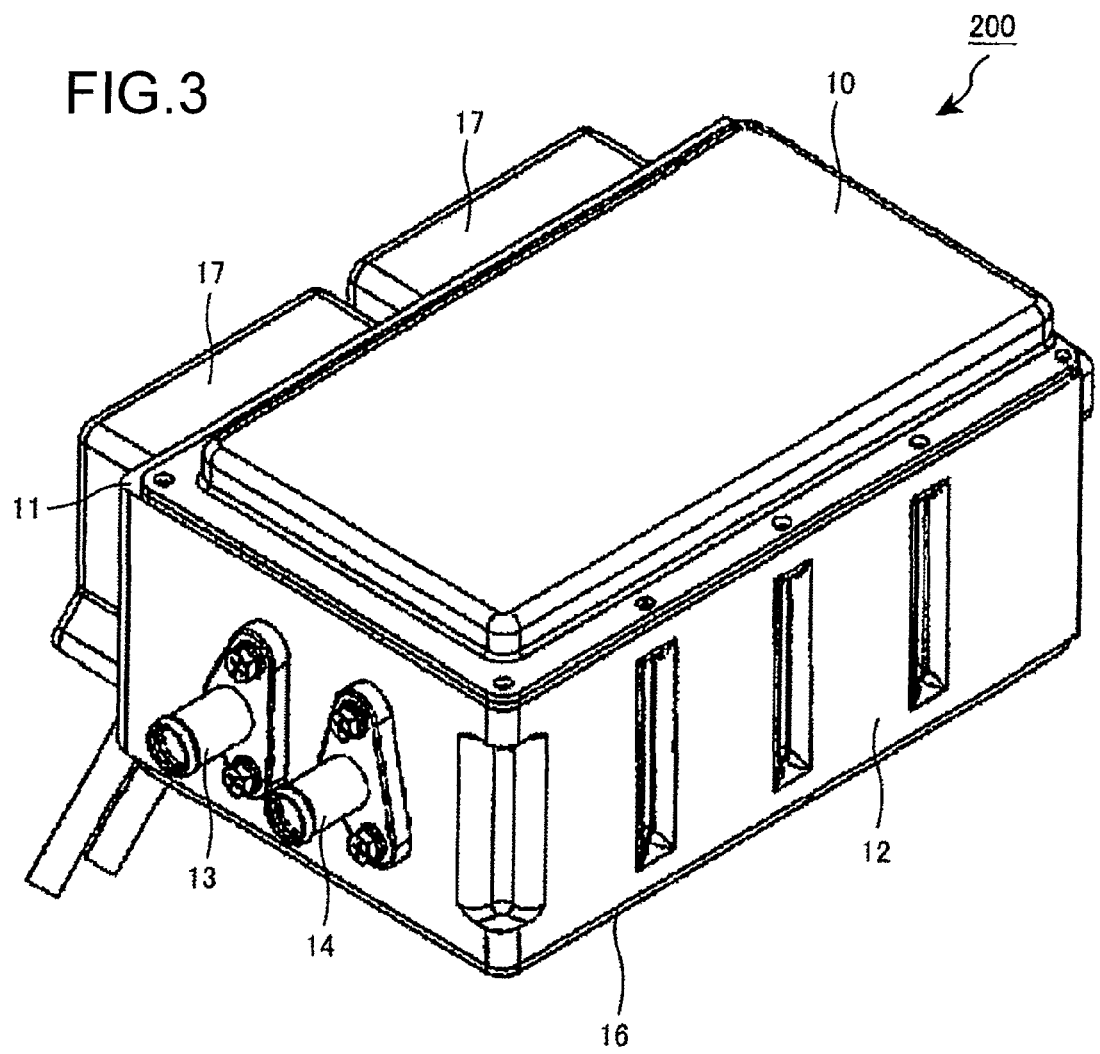
FIG. 3 is an external perspective view of the overall structure of the power conversion device 200.

FIG. 3 is an external perspective view of the overall structure of the power conversion device 200. Conduits for cooling water (an inlet conduit 13 and an outlet conduit 14) and two cases 17 for AC terminals for two motor generators are provided on side surfaces of a casing 12 whose bottom surface is roughly rectangular. Apart from the above, a DC terminal case is provided on the side opposite to the surface where the cooling water conduits are provided, although this case is not visible in FIG. 3. In this manner, regions for connection to the exterior are provided upon all of the sides of the casing 12.

Figure 4:
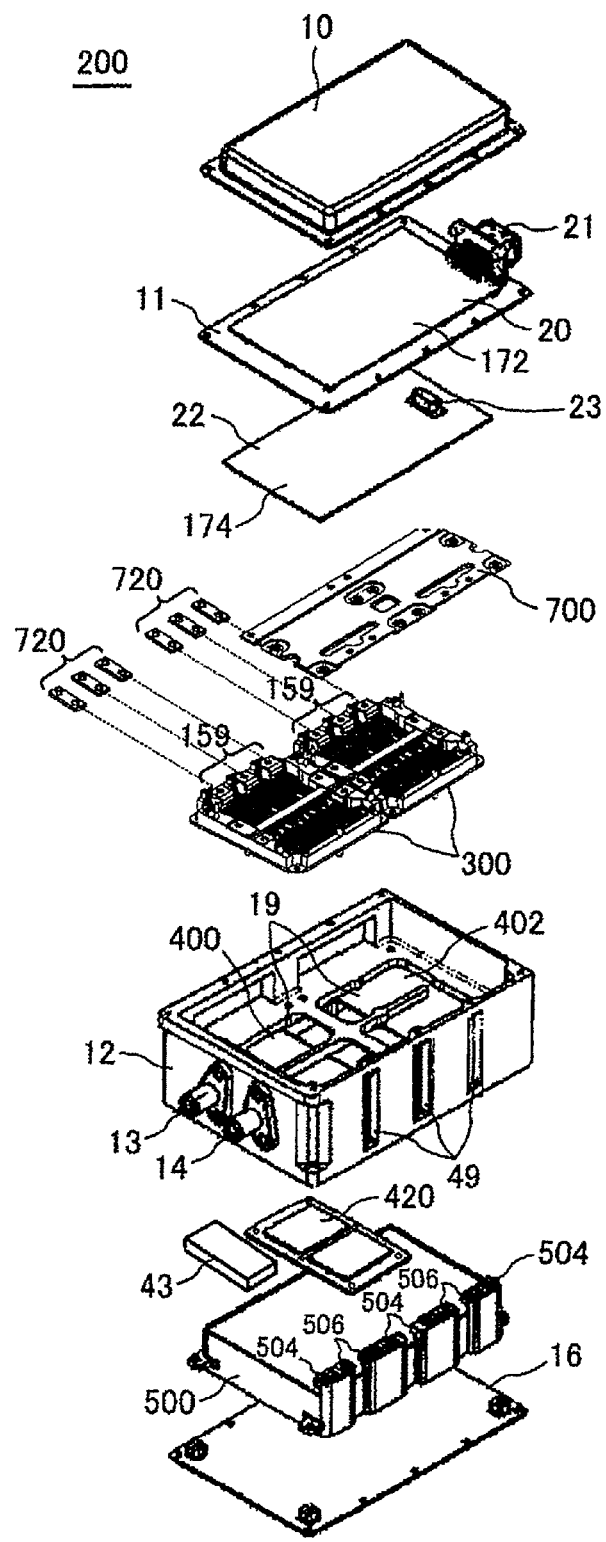
FIG. 4 is an exploded perspective view of the principal internal components of the power conversion device according to this embodiment.

FIG. 4 is an exploded perspective view of the principal internal components of the power conversion device according to this embodiment.

Two power modules 300 are disposed above a cooling water flow path 19 that is constructed in the central portion of the casing 12. A capacitor module 500 that is fixed to a lower casing lid portion 16 are housed in the lower portion of the casing 12. By providing this structure in which the power modules 300 and the capacitor module 500 sandwich the cooling water flow path 19 between them, the power modules 300 and the capacitor module 500 are cooled with good efficiency, even though they generate large amounts of heat. The power modules 300 and the capacitor module 500 are electrically connected together via a DC side conductor plate 700. This electrical connection is described in detail subsequently with reference to FIG. 15.

A driver circuit board 22 upon which the driver circuit 174 is mounted is disposed above the power modules, indeed even above the DC side conductor plate 700. Due to this, control pins that stick out from the upper portion of the power modules 300 can be connected with solder to through holes formed in the driver circuit board 22. As a result, the wiring for control becomes short, it becomes difficult for noise to penetrate into the wiring for control, and it is possible to prevent erroneous operation of the power module.

The lower opening of the casing 12 is blocked by the lower casing lid portion 16, for cooling the capacitor module 500. Furthermore, the upper opening of the casing 12 is blocked by a metallic base plate 11, for cooling the control circuit 172 and so on. And a further upper casing lid portion 10 is fitted upon the casing 12, so as to cover over the metallic base plate 11.

The control circuit 172 is housed in a space defined at the upper portion of the casing 12 by the metallic base plate 11 and the upper casing lid portion 10. Due to this, the beneficial effect is obtained of separating the high voltage system of the power module 300 and the capacitor module 500, and the low voltage system of the control circuit 172, thus shielding the control circuit 172 from noise. And, due to this, the casing 12 and the upper casing lid portion 10 are made from a metallic material such as aluminum or the like whose electrical conductivity is good.

Moreover, since the metallic base plate 11 is sandwiched between the upper casing lid portion 10 that is made from metal and the casing 12 that is also made from metal, accordingly the thermal transmission becomes satisfactory between the metallic base plate 11 and the upper casing lid portion and the casing 12 that is metallic. Due to this, heat from heat generating elements upon the control circuit 172 that is installed upon the metallic base plate 11 can escape to the upper casing lid portion 10 and to the casing 12. And, for this reason, the casing 12 and the upper casing lid portion 10 are made of a metallic material such as aluminum or the like whose thermal conductivity is good.

Furthermore, the metallic base plate 11 is sandwiched by the upper casing lid portion 10 and the casing 12, and moreover is solidly fixed to the casing 12 by fixing means such as screws or the like. Since it is possible to enhance the resistance to vibration in this way, it is possible to install the control circuit 172 even in the upper portion of the power conversion device 200, where it is particularly easy for it to suffer from the influence of vibration when the vehicle is traveling. Moreover, it is also possible to protect the control circuit 12 from dust and moisture and so on.

Opening portions 404 are formed in the lower side of the cooling water flow path 19 in order to make manufacturing it by aluminum casting easier, and these opening portions 404 are blocked by lower water path cover portions 420. Furthermore, the inverter device 43 for auxiliary machinery is attached below the cooling water flow path 19 on its lower side. This inverter device 43 for auxiliary machinery is fixed below the cooling water flow path 19 on its lower side, so that the heat dissipation metallic surfaces of the internally housed power modules face the lower surface of the cooling water flow path 19. Due to the flow of cooling water from the inlet and outlet conduits 13 and 14 along the cooling water flow path 19, heat dissipation fins possessed by the two power modules 300 that are arranged side by side are cooled, so that each of the two power modules 300 is cooled as a whole. And the inverter device 43 for auxiliary machinery that is provided upon the lower surface of the cooling water flow path 19 is also cooled at the same time.

Furthermore, due to the casing 12 being cooled by the provision of the cooling water flow path 19, the lower casing lid portion 16 that is provided at the lower portion of the casing 12 is cooled. Due to this cooling, the heat from the capacitor module 500 is thermally conducted to the cooling water via the lower casing lid portion 12 and the casing 12, so that the capacitor module 500 is cooled.

In this manner, by providing the cooling water flow path 19 at the central portion of the casing 12, by disposing the power modules 300 for driving the vehicle at one side thereof, and by disposing the inverter device 43 for auxiliary machinery at the other side thereof, it is possible to provide cooling with good efficiency in a small space, and accordingly it becomes possible to make the power conversion device as a whole more compact. Moreover, by making the main construction of the cooling water flow path 19 in the central portion of the casing by aluminum casting together integrally with the casing 12, in addition to the advantageous effect of enhancing the cooling, there is also the advantageous effect that the mechanical strength of the cooling water flow path 19 is made stronger. Furthermore, by employing aluminum casting, it is possible to form the casing 12 and the cooling water flow path 19 as an integrated structure, so that the cooling efficiency is enhanced because the thermal conduction becomes good.

An inter-board connector 23 is provided to the driver circuit board 22, and passes through the metallic base plate 11 and establishes connection with the group of circuits upon the control circuit board 20. Furthermore, a connector 21 that makes electrical connection to the exterior is provided to the control circuit board 20. Transmission of signals to and from the exterior of the power conversion device is performed via this connector 21. For example, transmission of signals to or from a lithium battery module that is mounted to the vehicle and that serves as the battery 136 is performed in this way, and signals may be sent from the lithium battery module that specify its state, or that specify its charge state.

This inter-board connector 23 is provided in order to perform transfer of signals to and from the control circuit 172 that is supported upon the control circuit board 20. Although not shown in the figures, the signal line 176 shown in FIG. 2 is provided, and signals for the switching timings of the inverter circuit are transmitted from the control circuit board 20 via this signal line 176 and the inter-board connector 20 to the driver circuit board 22. Gate drive signals, i.e. drive signals, are generated by the driver circuit board 22, and are supplied to the various gate electrodes of the power modules.

Figure 5:
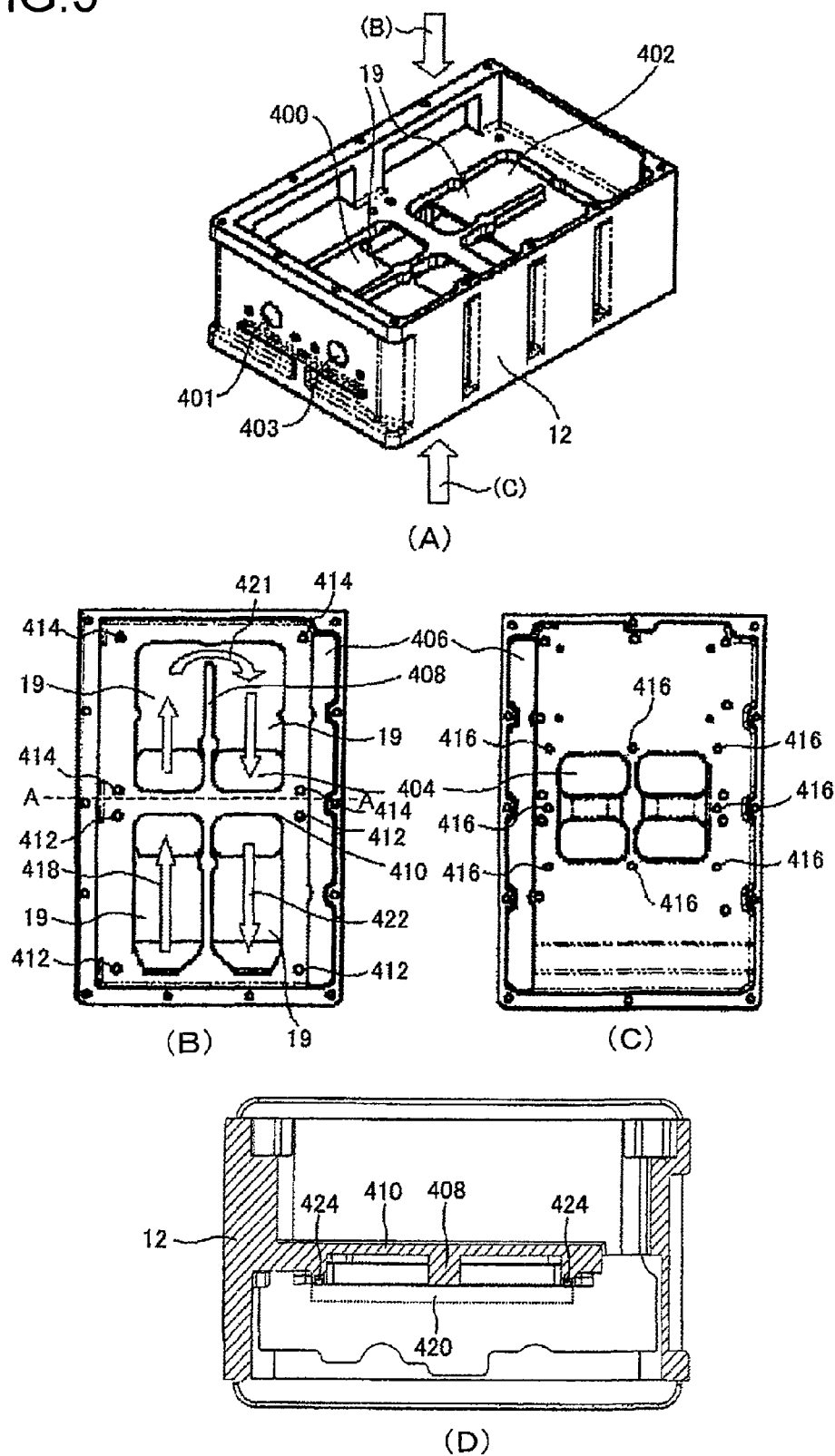
FIG. 5 is a figure showing a casing 12, being a cast aluminum element that has a cooling water flow path 19.
Figure 6:
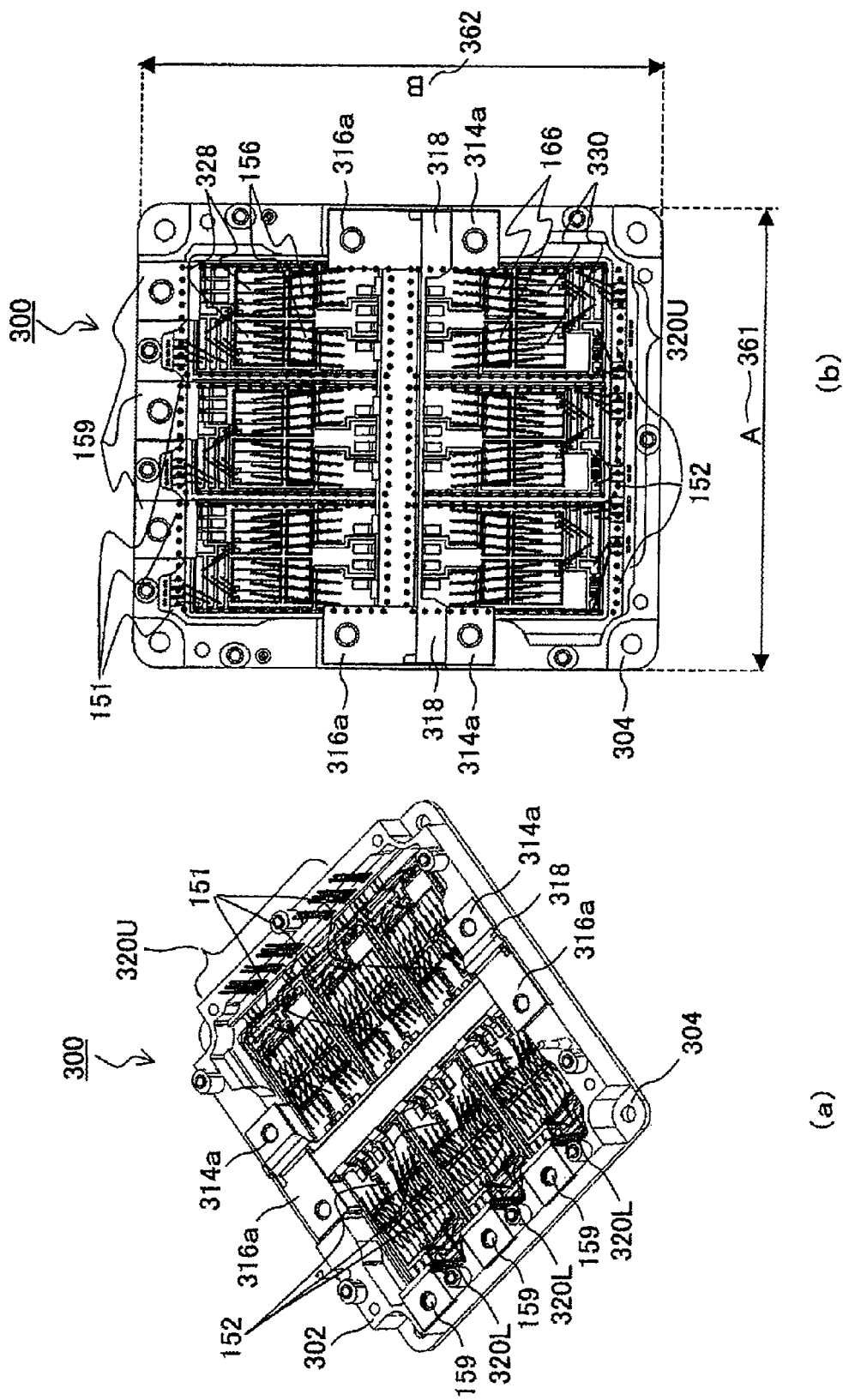
FIG. 6(a) is a perspective view from above of a power module (a semiconductor device) according to this embodiment.
FIG. 6(b) is a plan view of this power module.

FIG. 5 is a figure showing the casing 12, that is a cast aluminum element having the cooling water flow path 19: FIG. 5(A) is a perspective view of this casing 12; FIG. 5(B) is a plan view of the casing 12; FIG. 5(C) is an underneath view of the casing 12; and FIG. 5(D) is a figure showing a cross section of FIG. 5(B) along A-A. As shown in FIG. 5, the casing 12 and the cooling water flow path 19 that are provided internally to that casing 12 are cast as one unit. The upper surface and the lower surface of the casing 12 are formed approximately in rectangular shapes, with an inlet aperture 401 for inflow of cooling water being provided in the side of the casing at one of the short sides of this rectangle, and an outlet aperture 403 being provided in the same side thereof.

The cooling water that has flowed into the cooling water flow path 19 from this inlet aperture 401 flows in the coolant flow direction 418 shown by the arrow signs, in other words along one long side of the rectangle, and bends around as the coolant flow 421 shown by the arrow sign in the region near and before the other short side of the rectangle. And then this cooling water flows back along a long side of the rectangle for a second time in the coolant flow direction 422 shown by the arrow sign, and flows out of the outlet aperture 403. Two opening portions 400 and 402 are formed in each of the going-side and the return-side of the cooling water flow path 19. The power modules 300 are fixed so as to be lined up along the direction of flow of the casing 12, in other words in the direction along its long side. A support portion 410 is formed integrally with the casing, so that it is possible to close the opening portions of the cooling water flow path 19 perfectly with the power modules 300. This support portion 410 is positioned approximately in the center, and one of the power modules 300 is fixed, with respect to the support portion 410, at its side at which the cooling water enters and exits. Moreover, the other of the power modules 300 is fixed, with respect to the support portion 410, at its side at which the cooling water turns around and returns. The rigidity of the casing 12 becomes high due to this support portion 410, and, in particular, it is possible to reduce twisting of the casing 12 in the vertical direction with respect to the surface in which the flow conduit inlet aperture 401 is present. Furthermore since, in the casing 12 of this embodiment, the support portion 410 and a dividing wall 408 are formed as a cruciform shaped beam, accordingly it is possible further to reduce the twisting of the casing 12. Due to this, it is possible to suppress leakage into the interior of the casing 12 from the gaps between the casing 12 and the power modules 300. This fact is particularly effective in the so called direct cooling method in which the flow path is defined by blocking up the opening portions 400 and 402 with the metallic base 304.

The cooling water flow path 19 has the above described up and folded back shape, with the dividing wall 408 being provided so as to separate the going-side flow path and the return-side flow path, and this dividing wall 408 is made to be integral with the support portion 410. The dividing wall 408 performs the operation of functioning as a pathway for transmission of heat between the going-side passage and the return-side passage, and thus performs the operation of making the temperature of the cooling water more uniform. Normally, the temperature difference of the cooling water between the inlet side and the outlet side becomes great, and unevenness of the cooling efficiency occurs, but, when this dividing wall 408 is made integrally with the support portion 410, and by the metallic base 304 being arranged to straddle the two-way flow path that is defined by the dividing wall 408, it is possible to maintain the uniformity of cooling efficiency over the entire power module.

The screw holes 412 shown in FIG. 5(B) are used for fixing the power module 300 on the outlet and inlet aperture side to the cooling water flow path 19, and due to this fixation the opening portions 400 are sealed. Moreover, the screw holes 414 are used for fixing the power module 300 on the folding back side to the cooling water flow path 19, and due to this fixation the opening portions 402 are sealed.

The power module 300 on the side close to the outlet and inlet apertures comes to be cooled by the cold cooling water that flows in from the inlet aperture 401, and by the comparatively warm cooling water that is being sent to the outlet aperture 403. On the other hand, the power module 300 that is close to the folded back side of the flow path is cooled by the cooling water that is warmed up by the power module 300 on the side close to the outlet and inlet apertures and thus is somewhat warmer than the cooling water that flows in from the inlet aperture 401, but is cooled to a temperature lower than that of the cooling water near to the outlet aperture 403. As a result, the relationship in which the folded back cooling passage and the two power modules 300 are arranged provides a state in which the efficiency for cooling of the two power modules 300 is balanced.

Moreover, since the support portion 410 is provided, the flow path forming portion can form a tunnel type structure, so that the cooling water can pass directly under that support portion 410. The opening portions 404 are formed in the casing 12 underneath the support portion 410, and moreover this opening portions 404 are blocked up by the lower water path cover portions. Due to this type of structure, it becomes simple to manufacture the casing 12 by die casting, and thus the productivity for this inverter device is enhanced.

To give a detailed explanation using the drawing, the rear surface of the cooling water flow path 19 is shown in FIG. 5(C), and the opening portions 404 are formed in the rear surface that corresponds to the support portion 410. Due to these opening portions 404, directly under the support portion 410, the double layered structure of the support portion 410 and the flow path forming portion disappears, and thus the manufacture by die-casting becomes simple. In other words since, in FIG. 5(D) that is a sectional view of FIG. 5(B) along A-A, the opening directly underneath the support portion 410 is blocked up by the covers, accordingly the cooling water flow path 19 does not have a double layered structure in its interval from the inlet aperture 401 to the outlet aperture 403. Thus the productivity during manufacture is enhanced by it becoming possible to cast the casing 12 as one integrated unit together with the cooling water flow path 19, and moreover the yield rate for casting of the casing 12 as one integrated unit also becomes enhanced.

Furthermore, the casing construction shown in FIG. 5 has a structure that is particularly adapted to production by aluminum diecasting. In other words, the advantageous effect is obtained that it is possible to manufacture the integrated structure of the cooling water flow path 19 and the casing 12 in a form close to perfection. By making the folded back portion of the water path that has the coolant flow 421 as shown by the arrow sign as one unit with the opening portions 402, it becomes possible to cast the folded back portion integrally. In other words, the folded back passage may be perfected just by fixing the power module 300 to the opening portions 402. Furthermore, by making it possible to utilize the folded back passage for cooling, it becomes possible to make the device as a whole more compact.

Since as described above it is possible to store the two separate power modules that are of the directly cooled type in the casing 12, accordingly it is not necessary to utilize a single power module that would be large in size and also would have a complicated structure. Due to this, the yield rate during manufacture of the power modules is enhanced, and as a result it is possible to reduce the manufacturing cost of the inverter device.

Between the side portion of the cooling water flow path 19 and the long side of the rectangle, an aperture 406 is formed so as to pierce between the upper side and the lower side of the passage. Since electrical components are fitted on both sides of the cooling water flow path 19 so as to sandwich it between them, accordingly it becomes necessary electrically to connect together these electrical components on the two sides thereof. This aperture 406 is an aperture for establishing electrical connection between such electrical components on the two sides of the cooling water flow path 19.

Furthermore, O-rings 424 are used for the seals between the power modules 300 and the casing 12, and for the seals between the lower water path cover portions 420 and the casing 12. Airtightness testing for these O-rings 424 is performed directly after the process of fitting the power modules 300 and the lower water path cover portions 420. In concrete terms, first, the lower water path cover portions 420 are attached to the casing 12, and thereafter the power modules 300 are attached to the casing 12. And then airtightness testing of the O-rings 424 is implemented either by the method of blowing pressurized air into the casing 12, or by the method of flowing liquid thereinto. By doing this, it is possible to perform airtightness testing of the O-rings 424, in other words testing for water leakage of the water path, at an initial stage of the process of manufacturing the inverter device, so that it is possible to eliminate faulty production at an early stage, and accordingly the advantageous effect is obtained of enhancement of the productivity. This type of testing for water leakage of the water path is, in particular, very important for this inverter device of the directly cooled type in which the flow path is defined by the metallic base 304 and so on. It should be understood that, instead of using O-rings for sealing between the lower water path cover portions 420 and the casing 12 as in this embodiment, it would also be acceptable to arrange to apply a sealing material in liquid form to the joining portions between the lower water path cover portions 420 and the casing 12. By doing this, automation of the process of manufacture of the inverter device becomes simple, so that the productivity is enhanced.

The detailed structure of the power modules 300 of the power conversion device according to this embodiment will now be explained in the following, using FIGS. 6 through 13.

Figure 7:
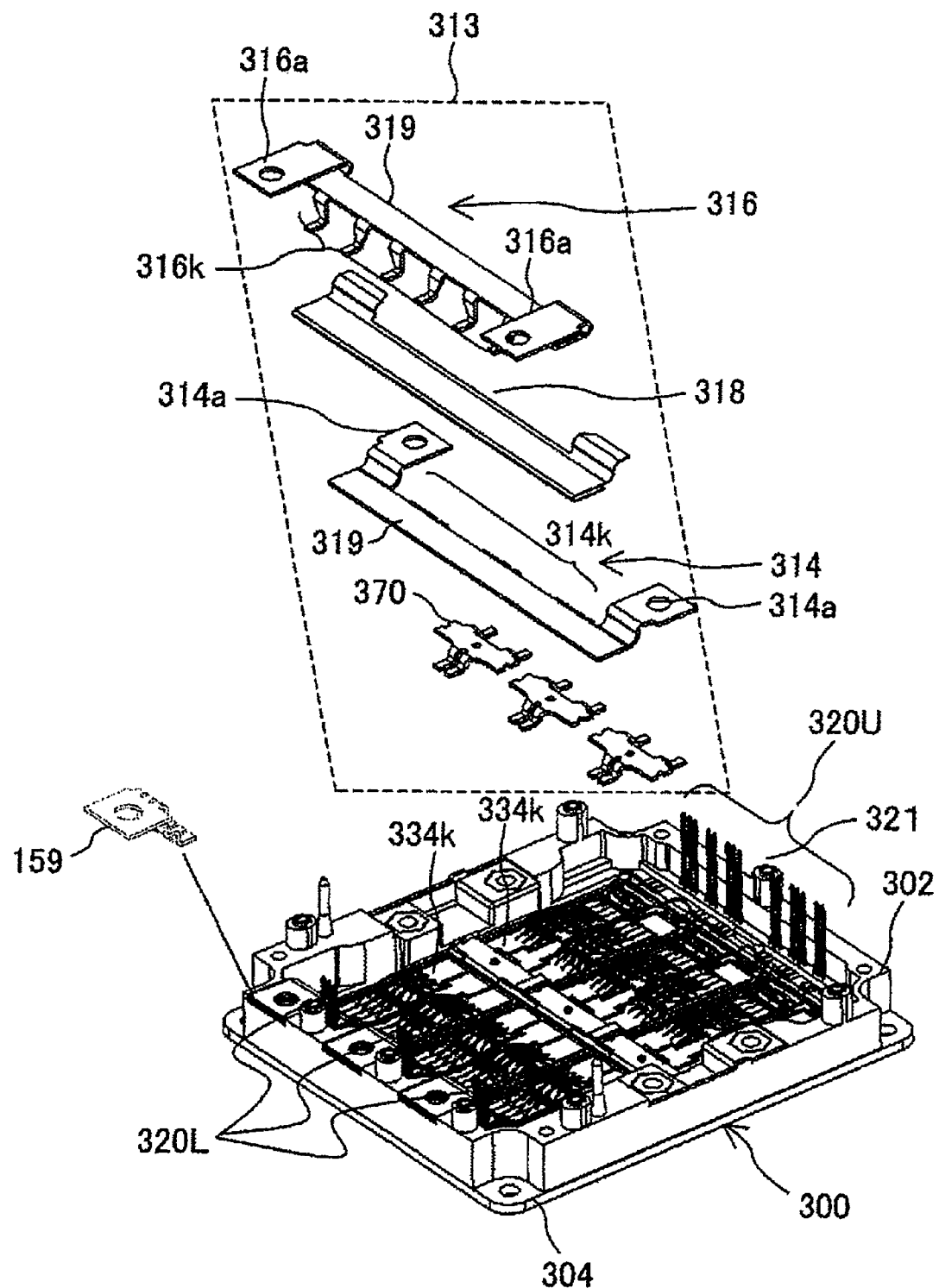
FIG. 7 is an exploded perspective view of a DC terminal of this power module (semiconductor device) according to this embodiment.

FIG. 6(a) is a perspective view from above of one of the power modules (i.e. of one of the semiconductor devices) according to this embodiment, and FIG. 6(b) is a plan view of this power module. Moreover, FIG. 7 is an exploded perspective view of DC terminals of this power module (i.e. of this semiconductor device) according to this embodiment. And FIG. 8 is a sectional view for facilitating the understanding of the construction of a DC bus bar, with a portion of the power module case 302 being considered as being transparent The reference symbol 300 denotes the power module; 302 is the power module case; 304 is the metallic base; 305 are fins (refer to FIG. 8); 314 is a DC positive electrode terminal; 316 is a DC negative electrode terminal; 318 is insulating paper (refer to FIG. 7); 320U and 320L are control terminals of the power module; 328 is an IGBT for an upper arm; 330 is an IGBT for a lower arm; 156 and 166 are diodes; 334 is an insulating board (refer to FIG. 8); 334k is a circuit wiring pattern upon the insulating board 334 (refer to FIG. 8); and 334r is circuit wiring underneath the insulating board 334 (refer to FIG. 8).

To consider the broad divisions of the power module 300, it consists of a semiconductor module portion, the metallic base 304, and connection terminals to the exterior (the DC positive electrode terminal 314 and the control terminal 320U and so on). The semiconductor module portion includes wiring within the power module case 302 that is formed from resin material or the like. The metallic base 304 is made from a metallic material such as, for example, Cu, Al, AlSiC or the like. And, as terminals for connection to the exterior, this power module 300 has AC terminals 159 for the U, V, and W phases for connection to the motor, and the DC positive electrode terminal 314 and the DC negative electrode terminal 316 for connection to the capacitor module 500.

Furthermore, the upper and lower arm IGBTs 328 and 330 and the diodes 156 and 166 are provided upon the insulating board 334 of the semiconductor module portion, and these are protected by resin or silicon gel (not shown in the figures). It would also be acceptable for the insulating board 334 to be a ceramic board; or it could be a thin insulating sheet. In order to dissipate heat to the cooling water with good efficiency, the metallic base 304 has fins 305 on the opposite side to the insulating board 334.

Figure 8:
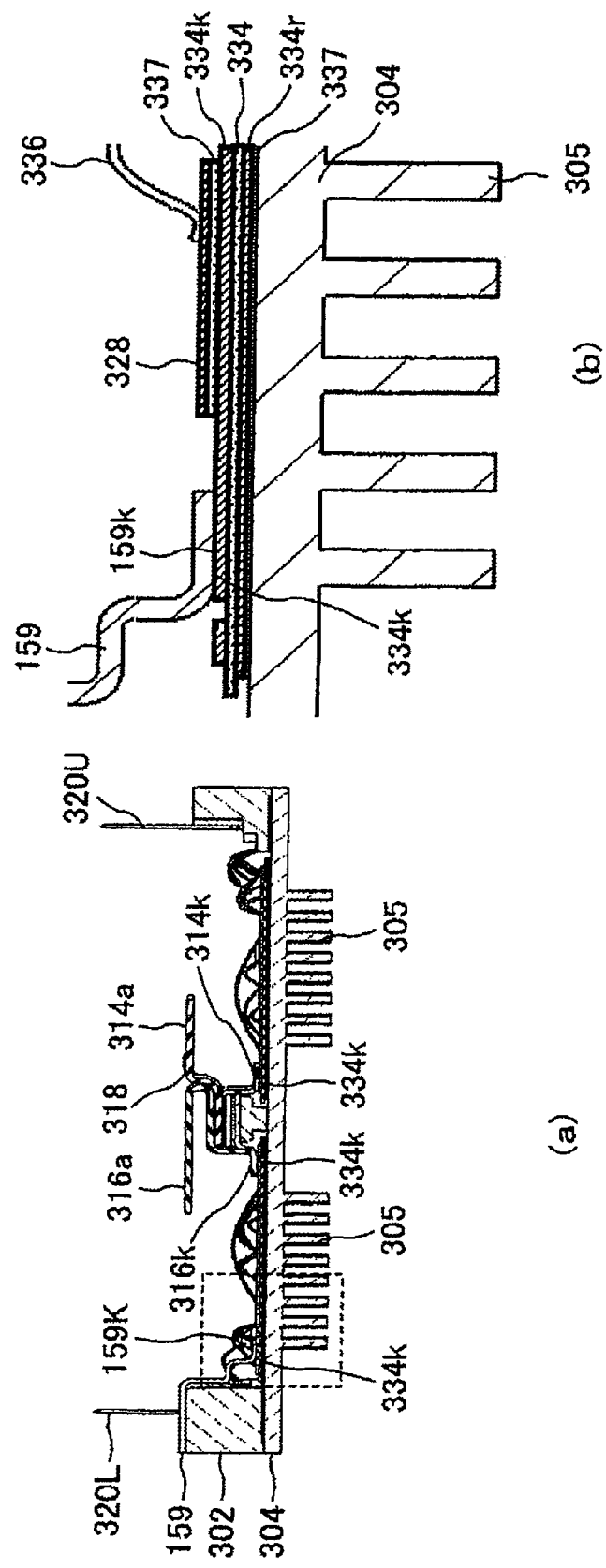
FIG. 8 is a sectional view in which a portion of the power module case 302 is considered as transparent.

As shown in FIG. 8, the power module case 302 made from resin which houses the IGBTs and the diodes included in the inverter circuit is provided on one of the surfaces of the metallic base 304. And the fins 305 are integrally attached by brazing or the like to the other surface of the metallic base 304. Furthermore, it would also be acceptable to integrally form the metallic base 304 and the fins 305 by forging. By thus integrally forming the metallic base 304 and the fins 305 by forging, along with enhancing the productivity during manufacture of the power modules 300, it is also possible to anticipate that the thermal conductivity from the metallic base 304 to the fins 305 will be enhanced. Due to this, it is possible to enhance the dissipation of heat from the IGBTs and the diodes. Moreover, ratchet deformation of the metallic base 304 originating due to temperature cycling may be suppressed by making the Vickers hardness of the metallic base 304 to be 60 or greater, and thereby it is possible to enhance the quality of sealing between the metallic base 304 and the casing 12. Furthermore, as shown in FIG. 8(a), the fins 305 are provided to correspond to each of the upper arms and the lower arms individually. These fins 305 project into the water path from the opening portions formed in the cooling water flow path 19, as it goes up and back again. The metallic surface of the metallic base 304 around the fins 305 is used for closing these opening portions provided in the cooling water flow path 19.

It should be understood that while, in this embodiment, the shape of the fins 305 is pin shaped, in some other embodiment, it would be acceptable for them to be shaped as straight, formed along the flow direction of the cooling water. If a straight shape is used as the shape for the fins 305, then it is possible to reduce the pressure for flowing the cooling water, but on the other hand, if a pin shape is used, then it is possible to enhance the cooling efficiency.

The insulating board 334 is fixed to one surface of the metallic base 304, and the chips constituting the IGBTs 328 and the diodes 156 for the upper arms and the IGBTs 330 and the diodes 166 for the lower arms are fixed upon this insulating board 334 by solder 337.

FIG. 6(b) is a structural arrangement diagram showing, in concrete terms, the type of configuration in which the upper and lower arm series circuits are installed upon the insulating board 334, and an explanatory figure for illustrating the functions thereof. The insulating board 334 is made from a ceramic that is adhered to the metallic base 304 and whose thermal conductivity is good. The current capacity that the upper and lower arms can transmit is increased by building these upper and lower arms with two chips being connected in parallel for each of the IGBTs 328 and 330 and the diodes 156 and 166 shown in FIG. 6(b).

As shown in FIG. 7, the DC terminal 313 that is housed internally to the power module 300 (the portion surrounded by the dotted line in FIG. 7) has a laminated construction in which the DC negative electrode terminal 316 and the DC positive electrode terminal 314 are laminated together with insulating paper 318 being sandwiched between them. Furthermore, the end portions of the DC negative electrode terminal 316 and the DC positive electrode terminal 314 are folded back in mutually opposite directions, and are formed into negative electrode side connection portions 316a and positive electrode side connection portions 314a for electrical connection to the DC side conductor plate 700 and to the power module 300. By two of the positive electrode side connection portions 314a for connection to the DC side conductor plate 700 being provided, the average distances from the negative electrode side connection portions 316a and the positive electrode side connection portions 314a to the three upper and lower arm series circuits become almost equal, so that it is possible to reduce variations due to parasitic inductance within the power module 300.

Furthermore, as shown in FIG. 7, when laminating together and assembling together the DC positive electrode terminal 314, the insulating paper 318, and the DC negative electrode terminal 316, a construction is employed in which the positive electrode side connection portions 314a and the negative electrode side connection portions 316a are folded back in mutually opposite directions. By curving the insulating paper 318 along the negative electrode side connection portions 316a, a proper creeping distance is ensured between the positive electrode terminals and the negative electrode terminals. When heat resistance is required, a composite sheet made from polyimide or meta-aramid fiber or a polyester whose tracking resistance is high or the like may be used for the insulating paper 318. Furthermore, in consideration of defects such as pin holes or the like, when the reliability is to be enhanced, two layers of the insulating paper 318 may be superimposed. Yet further, in order to prevent damage and tearing and so on, rounding may be provided upon the corner portions, or the roll over side formed by punching may be placed in the direction facing towards the insulating paper 318, so that the edges of the terminals do not touch the insulating paper. While, in this embodiment, insulating paper is used as the insulating material, in another embodiment, it would also be acceptable to arrange to coat the terminals with insulating material. In order to reduce the parasitic inductance, in the case of a power module whose withstand voltage is, for example, 600 V, the distance between the positive and negative electrodes may be made to be 0.5 mm or less, and the thickness of the insulating paper may be made to be half or less of this.

Even further, as shown in FIG. 7, the DC positive electrode terminal 314 and the DC negative electrode terminal 316 have connection tips 314K and 316K for connection to the circuit wiring pattern 334K. For each of the U phase, the V phase, and the W phase, two of each of these connection tips 314K and 316K are provided. Due to this, as will be described hereinafter, it is possible to establish connections to the circuit wiring pattern so that two small looped current paths are formed for each of the arms of each of the phases. Furthermore, the tip end portions of these connection tips 314K and 316K are folded, so that they project facing in the direction of the circuit wiring pattern 334K, and moreover so that they define joining surfaces to the circuit wiring pattern 334K. The connection tips 314K and 316K and the circuit wiring pattern 334K are connected together by solder or the like. Or they could also be connected together directly by ultrasound welding.

The power module 300, and in particular its metallic base 304, expands and contracts due to temperature cycling. Due to this expansion and contraction, a danger arises of the connection portions between the connection tips 314K and 316K suffering cracking or rupture.

Thus, as shown in FIG. 7, with the power module 300 according to this embodiment, the laminated flat member 319 that is formed by laminating together the DC positive electrode terminal 314 and the DC negative electrode terminal 316 is made so as to be roughly parallel to the plane of the metallic base 304 on its side on which the insulating board 334 is mounted. Due to this, it becomes possible for the laminated flat member 319 to operate so as to bend and return, corresponding to the bending and return of the metallic base 304 that is generated by the above described expansion and contraction. Because of this, it is possible to make small the rigidity, with respect to bending and return of the metallic base 304, and of the connection tips 314K and 316K that are formed integrally with the laminated flat member 319. Accordingly, it is possible to mitigate the stresses imposed between the connection tips 314K and 316K and the circuit wiring pattern 334K in the direction orthogonal to their joining surface, so that it is possible to prevent cracking or rupture at this joining surface.

It should be understood that, with the laminated flat member 319 according to this embodiment, in order for it to become possible to perform bending and return action corresponding to bending and return in both the width direction and the depth direction of the metallic base 304, the length of the laminated flat member 319 in the width direction is made greater than its length in the depth direction. For example, the length of the laminated flat member 319 in the width direction may be made to be 130 mm, while its length in the depth direction may be made to be 10 mm. Furthermore, the thickness of both the DC positive electrode terminal 314 and the DC negative electrode terminal 316 of the laminated flat member 319 may be set to be 1 mm, i.e. they may be set to be comparatively thin, so that it is easy to perform bending and return action.

FIG. 9(a) is a figure showing the metallic base 304 and one of the three upper and lower arm circuits, that are components extracted from the power module 300. And FIG. 9(b) is an exploded perspective view of the metallic base 304, the insulating boards 334 upon which circuit wiring patterns 334k and 334r are formed, IGBTs 328 and 330 including wires 336 of the upper wiring portion, diodes 156 and 166, an AC terminal 159, and a wiring connection terminal 370. It should be understood that, for the sake of explanation, the DC terminal 313 is omitted.

As shown in FIG. 9(a), one upper and lower arm series circuit 150 includes an upper arm circuit 151, a lower arm circuit 152, wiring connection terminals 370 for connecting the wiring of these upper and lower arm circuits 151 and 152 together, and an AC terminal 159 for outputting AC power.

Moreover, as shown in FIG. 9(b), the upper circuit 151 that is provided upon the metallic base 304 includes an insulating board 334 upon which a circuit wiring pattern is formed, IGBTs 328 that are provided upon the circuit wiring pattern 334k of the insulating board 334, and diodes 156.

Electrodes provided upon the rear surfaces of the IGBTs 328 and the diodes 156 are joined by soldering to the circuit wiring pattern 334k.

No pattern for wiring is formed on the rear surface of the insulating board 334 on which the circuit wiring pattern is formed, but rather a wide uniform pattern is formed. This wide uniform pattern on the rear surface of the insulating board is soldered to the metallic base 304.

In a similar manner to the upper arm, the lower arm circuit 152 also includes an insulating board 334 that is disposed upon the metallic base 304, a circuit wiring pattern 334k that is wired upon this insulating board 334, and IGBTs 330 and diodes 166 that are mounted upon this circuit wiring pattern 334k.

Furthermore, the electrodes on the rear surfaces of the IGBTs 330 and the diodes 166 are jointed to the circuit wiring pattern 334k by soldering. It should be understood that in this embodiment, each of the arms for each phase has a structure in which two circuit portions are connected in parallel, with each of these circuit portions including one IGBT 328 and one diode 156 connected in parallel. How many of these circuit portions are to be connected in parallel may be determined according to the flow rate of current to the motor-generator 192, and if a greater current than the current supplied to the motor-generator 192 according to this embodiment should be required to be supplied, then three or more circuit portions may be connected in parallel. Conversely, if the motor may be driven with a small current, then each of the arms for each of the phases may consist of a single circuit portion.

The current path of the power module 300 will now be explained using FIG. 9(b). The current that flows in the upper arm circuit of the power module 300 flows along: (1) a path from the DC positive electrode terminal 314 (not shown in the figure) to a connecting conductor portion 371U; (2) a path from the connecting conductor portion 371U via an element side connecting conductor portion 372U to electrodes on one side of the upper arm IGBTs 328 and the upper arm diodes 156 (i.e. electrodes on their sides that are connected to that element side connecting conductor portion 372U); (3) a path from the electrodes on the other sides of the upper arm IGBTs 328 and the upper arm diodes 156 via wires 336 to connecting conductor portions 373U; and (4) a path from the connecting conductor portions 373U via connection portions 374U and 374D of the wiring connection terminal 370 to a connecting conductor portion 371D. It should be understood that, as previously described, this upper arm consists of two of the circuit portions in which an IGBT 328 and a diode 156 are connected in parallel, connected in parallel. Accordingly, in the above described current path (2), the current branches into two in the element side connecting conductor portion 372U, and this branched off current flows to each of the two circuit portions.

Furthermore, the current that flows in the lower arm circuit of the power module 300 flows along: (1) a path from the connecting conductor portion 371D via an element side connecting conductor portion 372D to electrodes on one side of the IGBTs 330 and the diodes 166 (i.e. electrodes on their sides that are connected to that element side connecting conductor portion 372D); (2) a path from the electrodes on the other sides of the lower arm IGBTs 330 and the lower arm diodes 166 via wires 336 to connecting conductor portions 373D; and (3) a path from the connecting conductor portions 373D to the DC negative electrode terminal 316 (not shown in the figure). It should be understood that, as previously described, this lower arm consists of two of the circuit portions in which an IGBT 330 and a diode 166 are connected in parallel. Accordingly, in the above described current path (1), the current branches into two in the element side connecting conductor portion 371D, and this branched off current flows to each of the two circuit portions.

Here, the connecting conductor portion 371U for connecting together the IGBTs 328 (and the diodes 156) of the upper arm circuit and the DC positive electrode terminal 314 (not shown in the figure) is arranged on one edge of the insulating board 334, in the vicinity of the approximately central portion thereof. And the IGBTs 328 (and the diodes 156) are mounted in the neighborhood of the other edge of the insulating board 334, opposite to the position at which the connecting conductor portion 371U is arranged. Furthermore, in this embodiment, the two connecting conductor portions 373U that are provided are arranged in a row along that one edge of the insulating board 334, with the connecting conductor portion 371U being positioned between them.

This type of circuit pattern and mounting pattern, in other words the circuit wiring pattern upon the insulating board 334, consists of a roughly letter-T shaped wiring pattern, and two wiring patterns (371U) arranged on both sides of the vertical bar (371U) of this roughly letter-T shaped wiring pattern. And, by providing the terminals from the connecting conductor portions 371U and 373U, the transient current path when the IGBTs 328 are turned ON becomes a letter-M shaped current path, like the transient current 350 (denoted by the broken lines) when the lower arms are turned ON, as shown by the arrow signs in FIG. 9(b). In other words, it becomes two small looped current paths (for the directions of the arrow signs when the lower arms are turned ON, refer to FIG. 16). Magnetic fields created by the transient currents when the lower arms are turned ON are generated around these two small looped current paths, as shown by the solid lines 350H in FIG. 9(b). And, due to these magnetic fields 350H, eddy currents 340 are induced in the metallic base 304 that is disposed underneath the insulating board 334. And since these eddy currents 340 generate magnetic fields 340H in the direction to cancel out the magnetic fields 350H, accordingly they can reduce the parasitic inductance that is present in the upper arm circuit.

Furthermore, the two small looped currents described above create two U-turn currents, such that the currents that flow in the insulating board 334 mutually cancel one another out. Due to this, as shown by the magnetic fields 350H in FIG. 9(b), it is possible to reduce the parasitic inductance in the interior of the power module 300, since it is possible for smaller loop magnetic fields to be created. Furthermore, the magnetic field loops that are created during switching are small, so that it is possible to confine the magnetic field loops in the interior of the power module. Due to this, the currents induced in the casing outside the power module are reduced, and also it is possible to prevent erroneous operation of the control boards and the escape of electromagnetic noise to the exterior of the power conversion device.

The same type of circuit wiring pattern and mounting pattern as described above for the upper arm is used for the lower arm circuit side as well. In other words, the connecting conductor portion 371D for connection between the IGBTs 330 (and the diodes 166) of the lower arm circuit and the DC negative electrode terminal 316 (not shown in the figure) is disposed in the vicinity of approximately the central portion of one edge of the insulating board 334. And the IGBTs 330 (and the diodes 166) are mounted in the neighborhood of the other edge of the insulating board 334, opposite to the position at which the connecting conductor portion 371D is arranged. Furthermore, in this embodiment, the two connecting conductor portions that are provided are arranged in a row along that one edge of the insulating board 334, with the connecting conductor portion 371D being positioned between them.

By forming this type of circuit wiring pattern and mounting pattern, the advantageous effect is obtained of reducing the previously described parasitic inductance for the lower arm circuit side as well.

It should be understood that, in this embodiment, the inlet of the current path for each of the arms of each phase becomes (for example) the connecting conductor portion 371U that is sandwiched between the two connecting conductor portions 373U, while on the other hand the outlet of this current path becomes the two connecting conductor portions 373U. However, even if this inlet and outlet were to be reversed, still the previously described small looped current paths for each arm of each phase would be created. Due to this, it may be anticipated that the parasitic inductance of each arm of each phase would be reduced, and that electromagnetic noise would be prevented, in a similar manner to that previously described.

In the following, the vertical dimension of the power module 300 of this embodiment (the dimension denoted by the reference symbol A in FIG. 6(b)) and its horizontal dimension (the dimension denoted by the reference symbol B in FIG. 6(b)) will be discussed in detail.

With the power module 300 of this embodiment, the insulating boards 334 are arranged so that the edge of the insulating board 334 of the upper arm circuit, upon which the connecting conductor portions 371U and 373U are arranged, and the edge of the insulating board 334 of the lower arm circuit, upon which the connecting conductor portions 371D and 373D are arranged, oppose one another. Furthermore, the portions of the upper and lower arms that oppose one another are arranged so that they are at the approximately central portion upon the main surface of the metallic base 304. Yet further, upper and lower arm circuits to which are provided the same number of elements having the same functions are arranged along the edge of the B side of the metallic base 304 shown in FIG. 9(b). Moreover, the three phases (the U phase, the V phase, and the W phase) made up of upper and lower arm circuits are arranged along the A edge of the metallic base 304 shown in FIG. 9(b). In other words, the upper and lower arm circuits, whose vertical direction has become long due to the IGBTs 328 and the IGBTs 330 being arranged in a separated manner in order for small loop currents to be generated in each of the upper and lower arm circuits, are mounted along the B edge of the metallic base 304.

With this type of structure, each individual one of the power modules is close to square in shape, and moreover the length of the A edge of its metallic base 304 can be made to be shorter than its length B in the direction along the upper and lower arms (i.e. A<B). If, as shown in FIG. 4, two power modules are arranged along this A edge, then it is possible to prevent the A edges of these two power modules being very much longer than their B edges. In other words, it is possible to make twice the length A (i.e. 2A) when the two power modules 300 are lined up be less than twice the length (B) in the direction in which the upper and lower arms are lined up (i.e. 2A<2B). Due to this, the casing 12 does not become too long and narrow in the direction in which the two power modules are lined up, so that it is possible to enhance the rigidity of the casing 12, and thus to suppress twisting of the casing 12. As a result, it is possible to enhance the quality of sealing of the cooling water path, and thus to prevent water leakage. Moreover, since the casing does not become too long and narrow in one direction, accordingly it is possible for the housing to be formed in the shape of a rectangular parallelepiped, for which an in-vehicle space is easily available. Even further, it becomes possible further to enhance the quality of sealing for the cooling water path, since the shape of one of the power modules 300 is close to square, so that the twisting of the power module 300 itself is low.

It should be understood that, by establishing the relationship for one power module that the lengths of its A edge and its B edge satisfy B−A<A/2 or B−A<B/2, it is possible to make its shape more close to a square shape. Due to this, it is possible further to enhance the quality of sealing of the cooling water path.

Figure 9:
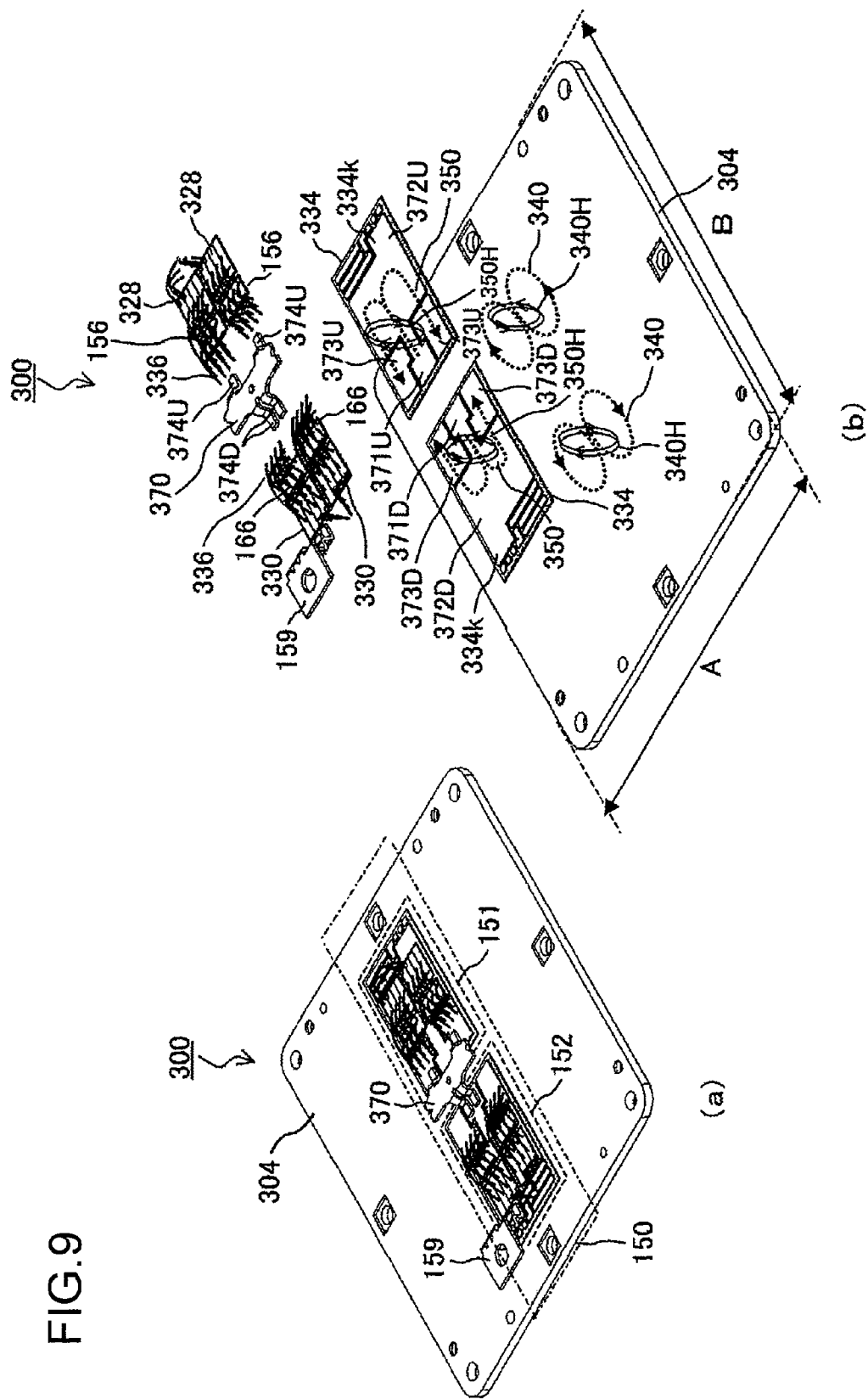
FIG. 9(a) is a figure in which a metallic base 304, that is a structural component of the power module 300, and one each of three upper and lower arm series circuits are shown as extracted.
FIG. 9(b) is an exploded perspective view of the metallic base 304, a circuit wiring pattern, and an insulating board 334.

Moreover, by arranging the IGBTs 328 (and the diodes 156) and the IGBTs 330 (and the diodes 166) as somewhat separated from one another along opposing edges of the metallic base 304, as shown in FIGS. 9(*b*), 8(*a*), and 6(*b*), the following further advantageous effects are obtained.

The IGBTs 328 for the upper arm circuits for each phase are driven to be switched ON and OFF by the driver circuit 174 controlling the gate voltages of these IGBTs 328. These drive signals are transmitted from the driver circuit 174 to the gate electrodes of the IGBTs 328 via the control terminals 320U that are lined up in a row along the A edge of the metallic base 304. In consideration of noise and productivity during manufacture, it is desirable for the distances between these control terminals 320U and the gate electrodes of the IGBTs 328 to be as short as possible. Furthermore, if the drive signal path for the upper arm and the drive signal path for the lower arm are remote from one another, then there is no interference between the signals in these drive signal paths, and erroneous operation does not take place. In particular, it is possible to prevent both the upper arm and the lower arm going ON at the same time, so that it is possible to prevent short circuiting and excess current, and to prevent destruction of the device. Thus, the control terminals 320U for the upper arm circuits and the control terminals 320D for the lower arm circuits are arranged along opposite edges of the metallic base 304. And the IGBTs 328 that correspond to the upper arm circuits are arranged in the neighborhood of the control terminals 320U, while the IGBTs 330 that correspond to the lower arm circuits are arranged in the neighborhood of the control terminals 320D. Due to this, along with it being possible to anticipate enhancement of the resistance to noise and of the reliability, it is also possible to enhance the productivity during manufacture, due to the fact that, as previously described, the shape of the power module 300 becomes close to a square shape.

Moreover, as shown in FIG. 5, the shape of the cooling water flow path 19 of the power conversion device 200 according to this embodiment is roughly a letter-U shape, having a going path and a return path. Since the cooling water does not flow through the dividing wall 408 of this letter-U shaped cooling water flow path 19, accordingly the cooling capability there is lower than at the places where the cooling water of the cooling water flow path does flow. Thus the DC positive electrode terminal 314 and the DC negative electrode terminal 316, that do not need to be cooled to any great extent, are disposed above this dividing wall 408, while on the other hand the IGBTs 328 (and the diodes 156) and the IGBTs 330 (and the diodes 166) that do need to be cooled are disposed above the cooling water paths. In other words, they are disposed near the opposite edges of the metallic base 304, somewhat separated from one another. Due to this, along with the shape of the power module 300 becoming close to a square shape as previously described, also it is possible to enhance the cooling performance for these elements, and it is possible to make the power module 300 as a whole more compact.

FIG. 8(*b*) is an enlarged schematic view of one of the connection portions 159*k* between the wiring upon an insulating board 334 and an AC terminal 159 (i.e. shows the portion surrounded by the dotted line in FIG. 8(*a*)). In the following, by way of example, a case in which the joining between the connection portion 159*k* to the AC terminal 159 and the circuit wiring pattern 334*k* upon the insulating board 334 is made with ultrasound will be explained in detail.

The connection portion 159*k* and the circuit wiring pattern 334*k* are superimposed, and are pressurized from the upper surface of the AC terminal 159 (the opposite side to that of the connection portion 159*k*). And, by energy being supplied to the connection portion 159*k* with ultrasound, the layers of oxide on their front surfaces are eliminated and their newly created surfaces are exposed and joined.

It should be understood that, in order for the connection area to be wide so as to obtain a satisfactory junction area, it is desirable for the surface roughness of the connection portion 159*k* to be reduced. For this, in the joining method according to this embodiment, during molding of the terminal, a part of the connection portion 159*k* of the AC terminal 159 is crushed by the application of pressure, so that the surface roughness of this connection portion 159*k* is reduced.

Figure 10:
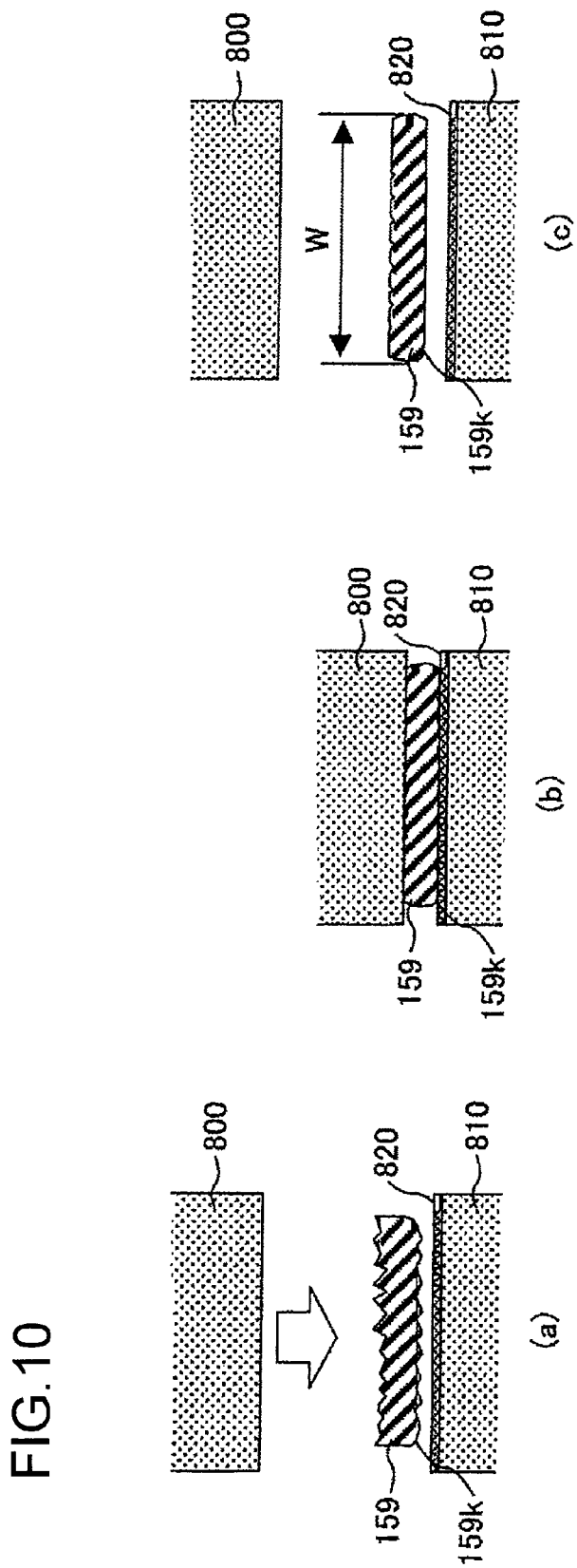
FIG. 10(a) through 10(c) are schematic figures showing steps of a pressing process.

FIGS. 10(*a*) through 10(*c*) are schematic figures showing the order in which pressure is applied. FIG. 10(*a*) shows the situation before pressing, FIG. 10(*b*) the situation during pressing, and FIG. 10(*c*) the situation after pressing.

As shown in FIG. 10(*a*), the pressing machine includes an upper side press unit 800 and a lower side press unit 810. A slab 820 that is processed to a mirror finish and moreover whose planarity is high is installed upon the pressure surface of this lower press unit 810. The connection portion 159*k* is pressed by the upper press unit 800 and the lower press unit 810 with this slab 820 interposed between them. Due to this, it is possible to reduce the surface roughness of the connection portion 159*k* of the AC terminal, and to improve its planarity. For example, if the width of the connection portion 159*k* (W in FIG. 10(*c*)) is around 2.5 mm, then it is possible to make its average roughness Ra, that is a value that specifies its surface roughness, be 50 nm or less, and, as for its maximum height, it is possible to make its central portion to be no more than 4 μm convex (the convexity of the connection portion 159*k* in the downward direction in FIG. 10).

If the junction surfaces are rough, then, when these junction surfaces are rubbed together by ultrasound, the joining energy of the ultrasound is consumed by making the concavities and convexities of the junction surfaces smaller, in other words by reducing their roughness. Due to this, the junction process partially starts at a point at which the concavities and convexities of the surfaces have not yet disappeared, so that a satisfactory junction area cannot be obtained. However, it is possible to implement stable joining of the junction areas during ultrasound joining by employing the method described above, since the initial area over which the junction surfaces contact one another is large. Even if plating with Ni has been performed over the circuit wiring pattern 334*k* upon the insulating board, still it is possible to obtain a satisfactory junction with ultrasound welding by reducing the surface roughness of the connection portion 159*k* by employing the method described above.

It should be understood that, if the junction is to be made by soldering or the like, then a more stable junction may be obtained by controlling the gap between the circuit wiring pattern 334*k* upon the insulating board and the connection portion 159*k*.

In the following, a construction for reducing the stress at the connection surface (i.e. at the surface that connects to the circuit wiring pattern 334*k*) of the AC terminal 159 that is used for the power module 300 according to this embodiment will be explained in detail.

Figure 11:
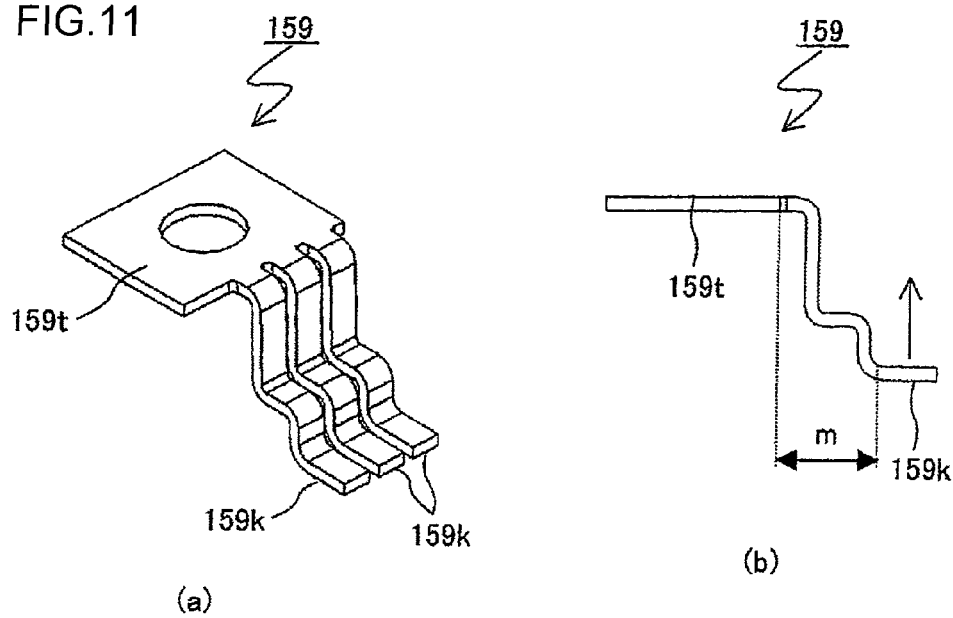
FIG. 11(a) is a perspective view of an AC terminal 159.
FIG. 11(b) is a side view of this AC terminal 159.

A motor side connection portion 159*t* that is formed at one end of the AC terminal 159 shown in FIG. 11 is fixed to the upper surface of the power module case 302. And connection portions 159*k* that are formed at the other end of the AC terminal 159 are fixed to the circuit wiring pattern 334*k* side. The metallic base 304, solder 337, and the circuit wiring pattern 334*r* under the insulating board and the insulating board 334 itself are located in the neighborhood of the motor side connection portion 159*t* and the connection portions 159*k*. Due to this, when temperature cycling is applied due to change of the temperature of the in-vehicle device and change of the external temperature, stress between the connection portion 159*k* and the circuit wiring pattern 334*k* occurs because of differences in the thermal expansion coefficients of these various members. Thus the AC terminal 159 according to this embodiment is shaped so as to reduce its rigidity, so that it is possible to reduce the stress that occurs due to this displacement during temperature cycling. It should be understood that it is desirable for the rigidity of the AC terminal 159 according to this embodiment to be less than or equal to 300 N/mm.

FIG. 11(*a*) is a perspective view of the AC terminal 159, while FIG. 11(*b*) is a side view of the AC terminal 159. The factors that contribute to the previously described rigidity of the AC terminal 159 are the "thicknesses" and the "lengths in the width direction" of the members that extend from the motor side connection portion 159*t* to the connection portions 159*k*, and the "lengths from the motor side connection portion 159*t* to the connection portions 159*k*" and the "shapes of those members".

First, the "thicknesses" and the "lengths in the width direction" of these members are determined according to the rate of flow of current that must be supplied to the motor-generator 192. In other words, when the "thicknesses" and the "lengths in the width direction" of these members are small, then the cross sectional areas of these members are undesirably small, so that their resistances to the flows of the currents described above become great. As a result, not only do generation of heat in these members, deterioration of the junction portion of the power module due to thermal expansion, melting of the resin of the power module case 302, destruction of the insulation and so on occur, but also a negative influence comes to be exerted upon the various elements (the IGBTs 328 and the diodes 156). Due to this, it is necessary to ensure that the "thicknesses" and the "lengths in the width direction" are at least equal to predetermined values. On the other hand, in order to reduce the rigidity of the AC terminal 159 as previously described, it is necessary to reduce the "thicknesses" and the "lengths in the width direction". In consideration of the above points, in this embodiment, the "lengths in the width direction" of the connection portions 159*k* are designed to be 2.5 mm, while their "thicknesses" are designed to be 1 mm.

The length m in FIG. 11(*b*) denotes the "length from the motor side connection portion 159*t* to the connection portions 159*k*". This length is the distance in the horizontal direction from the connection surface of the motor side connection portion 159*t* to the connection surfaces of the connection portions 159*k*. The greater this length is, the lower the rigidity of the AC terminal 159 can be made. However, if this length is too long, then the previously described resistance to the passage of current becomes large, and also the power module 300 is undesirably increased in size. Thus, in this embodiment, in consideration of the above points, this length is set to 5 mm. However, if the temperature width of the temperature cycling is great, then this length may also be set to greater than or equal to 5 mm, since the thermal stress is also great. Furthermore, since there is a tendency for the rigidity of the AC terminal to become large if the previously described "thickness" and "length in the width direction" are great, accordingly, in order to make the rigidity small, it is necessary for the "length from the motor side connection portion 159*t* to the connection portions 159*k*" to be made great. Conversely, since there is a tendency for the rigidity of the AC terminal to become small if the previously described "thickness" and "length in the width direction" are small, accordingly, in order to make the power module 300 more compact and so on, it is possible to make the "length from the motor side connection portion 159*t* to the connection portions 159*k*" small.

In this embodiment, the members that extend from the motor side connection portion 159*t* to the connection portions 159*k* have shapes that are bent to and fro in the shape of steps. Due to this shape, it becomes easy to insert the joining tool in order to perform ultrasound joining of the connection portions 159*k* and the circuit wiring pattern 334*k*. On the other hand, while the rigidity of the AC terminal has a tendency to become great due to this bent to and fro shape, in this case, it is possible to set that rigidity to an optimum value by adjusting the previously described "thickness", "length in the width direction", and "length from the motor side connection portion 159*t* to the connection portions 159*k*".

Figure 12:
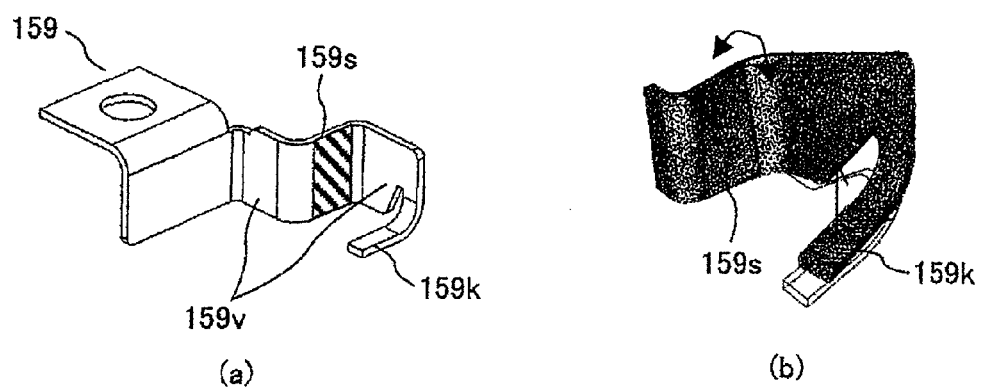
FIG. 12(a) is a perspective view of an AC terminal 159 according to another embodiment.
FIG. 12(b) is a side view thereof.

FIG. 12 shows a second embodiment of the AC terminal. FIG. 12(*a*) shows a perspective view, while FIG. 12(*b*) shows (partially) a deformation of this terminal in which the connecting surface has been displaced in the vertical direction.

The AC terminal 159 shown in FIG. 12 is made with a surface extending vertically with respect to the connection portion 159*k*, so that, due to this, the area when the vertically extending surface is projected upon the connection surface becomes small, and the merit of this is that it is possible to make the area that the terminal occupies upon the base area of the module more compact.

Moreover, with this terminal having the surface that extends in the direction perpendicular to the connection portion 159*k*, it is possible to make the rigidity small by inserting a vertical surface structure such as shown in FIG. 12(*a*), in other words the other vertical surface 159*s* that extends perpendicularly to the vertical surfaces 159*v*. The result of deformation analysis when a displacement in the upward direction (shown by the arrow sign) is applied to the connection portion 159*k* is shown in FIG. 12(*b*). The structure can function as a torsion bar spring due to the vertical surface 159*s* twisting, and it is possible to obtain a rigidity of 300 N/mm or less. It is possible to reduce the rigidity of the terminal by employing this type of terminal structure, and thus it is possible to minimize the stress upon the connection portion 159*k* during the temperature cycling previously described.

Figure 13:
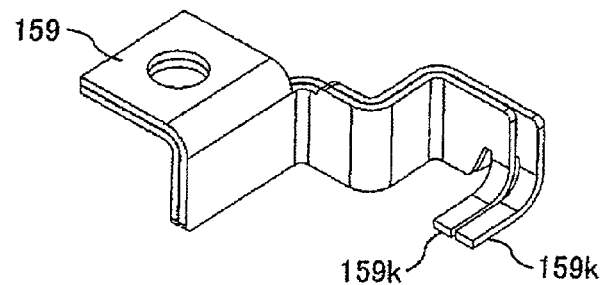
FIG. 13 is a perspective view of an AC terminal 159 according to another embodiment.

FIG. 13 shows a terminal construction that can carry high current. By superimposing two terminals as shown in FIG. 13, it is possible still to keep the rigidity low, while doubling the cross sectional area of the terminal.

Figure 14:
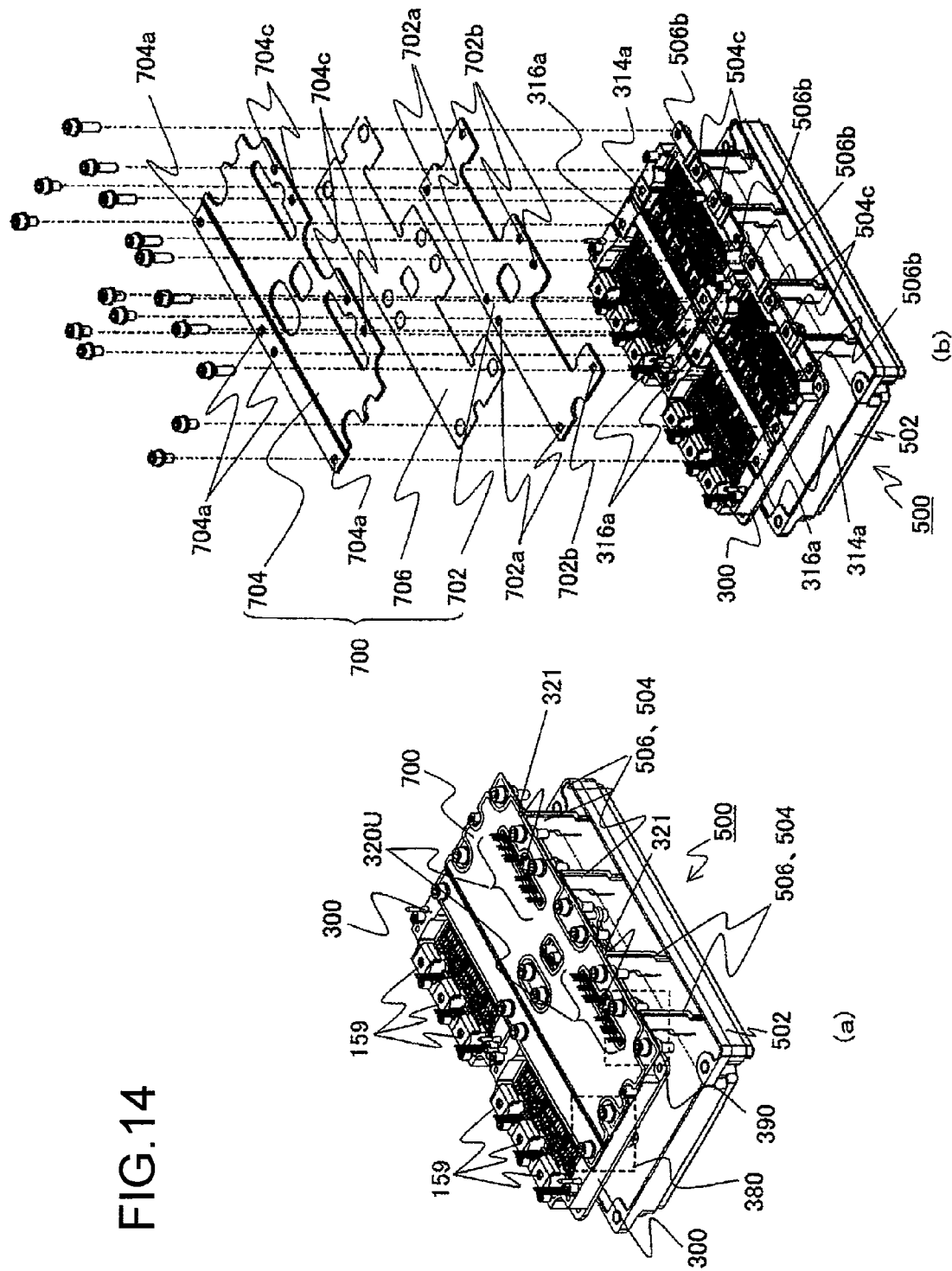
FIG. 14(a) is a perspective view in which only a capacitor module 500, a DC side conductor plate 700, and two power modules 300 of a power conversion device 200 according to this embodiment are shown as extracted.
FIG. 14(b) is a perspective view in which the DC side conductor plate 700 is exploded.

FIG. 14(*a*) is a perspective view in which only the capacitor module 500, the DC side conductor plate 700, and the two power modules 300 of the power conversion device 200 according to this embodiment have been extracted. And FIG. 14(*b*) is a perspective view in which the DC side conductor plate 700 is exploded.

As shown in FIG. 14(*a*), the two power modules 300 are lined up so that their AC terminals are aligned linearly. Electrical connection portions of the two power modules 300 and the capacitor module 500 are provided at positions on the opposite side from these AC terminals 159. The electrical connections to these two power modules 300 and to the capacitor module 500 are made by the flat plate shaped DC side conductor plate 700.

A large number of capacitor cells 514 (not shown in the figures) are stored within a capacitor case 502 that is fixed upon the lower casing lid portion 16, and positive electrode side capacitor terminals 506b and negative electrode side capacitor terminals 504c of the capacitor module are arrayed along one side of this capacitor case 502. This one side is the position at which the positive electrode side capacitor terminals 506b and the negative electrode side capacitor terminals 504c project out from the upper surfaces of the capacitor cells 514 (not shown in the figures).

As shown in FIG. 14, the DC side connector plate 700 that is connected to the power modules 300 is arranged so as to cover over the power modules 300. And the positive electrode side capacitor terminals 506b and the negative electrode side capacitor terminals 504c are formed in letter-L shapes, so as to stand up from the opening surface of the capacitor case 502. During assembly of the power conversion device 200, these letter-L shaped positive electrode side capacitor terminals 506b and negative electrode side capacitor terminals 504c are connected by bolts, so as directly to contact against the DC side conductor plate 700.

As shown in FIG. 14(b), this DC side conductor plate 700 is made from a flat plate shaped positive electrode conductor plate 702 and a flat plate shaped negative electrode conductor plate 704, with an insulating sheet 706 being sandwiched between this positive electrode conductor plate 702 and this negative electrode conductor plate 704. Since this laminated structure is employed, it is possible to anticipate reduction of the parasitic inductance from the power modules 300 to the capacitor module 500.

Furthermore, as shown in FIG. 14(a) and FIG. 6(b), the plurality of upper arm control terminals 320U are arranged near the vicinity of the central portions of the A edges of the power modules 300. In other words, the upper arm control terminals 320U are arranged in a row in the vicinity of the central portions of the A edges of the power modules 300 by arranging the U phase control pins near the V phase control pins, and the W phase control pins near the V phase control pins. The DC side conductor plate 700 has apertures 705 for passing this plurality of upper arm control terminals 320U. And the DC side conductor plate 700 is made in a wide laminated construction, so that the region where the positive electrode conductor plate 702 and the negative electrode conductor plate 704 are laminated together is wider than from one side to the other of these through holes 705. With these structures, it is possible to widen the area where the positive electrode conductor plate 702 and the negative electrode conductor plate 704 are laminated together, and moreover it is possible to anticipate reduction of the parasitic inductance from the power module 300 to the capacitor module 500.

Furthermore, bosses 321 for fixing the driver circuit 174 are arranged in the vicinity of the central portions of the edges of the power modules 300, in other words in the vicinity of the upper arm control terminals 320U. Along with the driver circuit 174 being fixed to these bosses 321, the upper arm control terminals 320U are passed through holes that are formed in the driver circuit 174. Thereafter, terminals upon the driver circuit 174 and the arm control terminals 320U are joined together by welding or the like. With this type of structure the resistance to vibration during motion of the vehicle is enhanced, since the junction portions between the upper arm control terminals 320U and the terminals upon the driver circuit 174 become close to the bosses 321.

Furthermore, the driver circuit board 22 (refer to FIG. 4) is disposed over the DC side conductor plate 700. Thus, as shown in FIG. 14(b), the DC side conductor plate 700 includes the negative electrode conductor plate 704 on the side of the driver circuit board 22, and on the other hand the positive electrode conductor plate 702 on the side of the power modules 300. Due to this, the negative electrode conductor plate 704 that is at low voltage and the insulating sheet 706 are present between the positive electrode conductor plate 702 that is at high voltage and the driver circuit board 22, so that it is possible to prevent the driver circuit board 22 from touching the high voltage.

As shown in FIG. 14(b), the positive electrode conductor plate 702 is arranged so as to extend over the two power modules 300, and moreover is connected by wiring to the two power modules 300 and to the capacitor module 500. In a similar manner, the negative electrode conductor plate 704 is arranged so as to extend over the two power modules 300, and moreover is connected by wiring to the two power modules 300 and to the capacitor module 500.

Due to this, since the DC side conductor plate 700 is quite wide, it is possible to reduce the parasitic inductance from the power modules 300 to the capacitor module 500. Moreover it is possible further to reduce the parasitic inductance, since four connection regions to the capacitor module 500 are present for a single power module. Furthermore, it is possible to keep the number of components in the power conversion device 200 as a whole low, due to the fact that the connecting conductors from the two power modules 300 to the capacitor module 500 are shared between the two power modules 300, so that it is possible to enhance the productivity during manufacture.

Furthermore, taking one positive electrode side connection portion 314a and one negative electrode side connection portion 316a in one power module 300 as one group, one group of a positive electrode side connection portion 314a and a negative electrode side connection portion 316a is arranged along one edge of the power module 300, and another group of a positive electrode side connection portion 314a and a negative electrode side connection portion 316a is arranged along the edge on the side opposite thereto. The DC side conductor plate 700 is arranged so as to extend over these two groups of one positive electrode side connection portion 314a and one negative electrode side connection portion 316a, and moreover is connected to the positive electrode side connection portions 314a and the negative electrode side connection portions 316a by screws. Due to this, it is not the case that the DC current supplied from the capacitor module 500 becomes concentrated upon one of the groups consisting of a positive electrode side connection portion 314a and a negative electrode side connection portion 316a; in other words, it is possible to reduce the inductance from the power modules 300 to the capacitor module 500, since the DC current comes to be shared between the two groups consisting of a positive electrode side connection portion 314a and a negative electrode side connection portion 316a.

Figure 21:
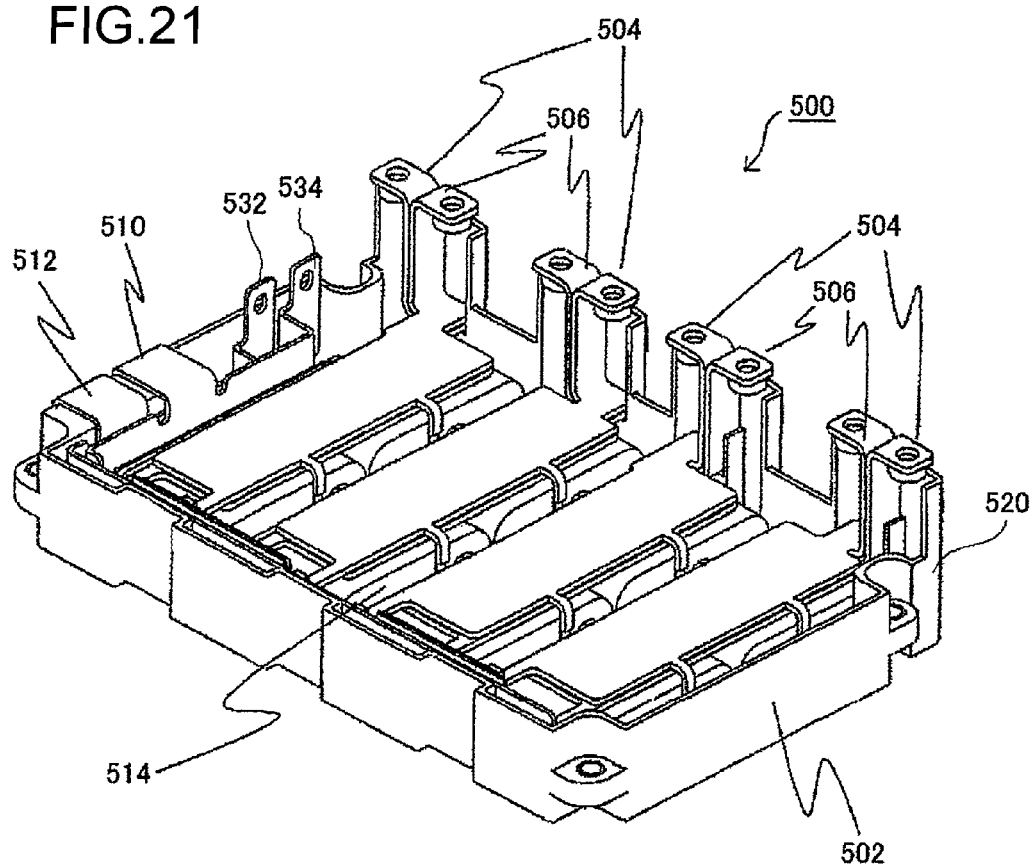
FIG. 21 is a perspective view showing the situation before a filler material 522 such as resin or the like is charged into the interior of the capacitor module shown in FIG. 20, for easier understanding thereof.

Furthermore, as described hereinafter with reference to FIG. 21, a plurality of the capacitor cells 514 are provided, housed internally to the capacitor module 500. In this embodiment, this plurality of capacitor cells 514 is divided into four groups, and moreover conductors (positive electrode conductor plates 507 and negative electrode conductor plates 505) are provided having widths corresponding to each of these groups. As shown in FIG. 21, negative electrode side capacitor terminals 504 and positive electrode side capacitor terminals 506 are connected to each of these wide conductors, respectively. In this embodiment, all of these negative electrode side capacitor terminals 504 and positive electrode side capacitor terminals 506 are electrically connected to the single set of DC side conductor plate 700. Due to this, all of the capacitor cells 514 are in the relationship of being electrically connected to the two power modules 300, and it is possible to use the electrostatic capacity of all of the capacitor cells 514 approximately equally, so that it is possible to prolong the component life of the capacitor module 500 as a whole. Moreover, it is possible to build the interior of the capacitor module 500 as being divided up into the capacitor cells 514 while using this single set of the DC side conductor plate 700, so that it is possible to vary the number of the capacitor cells 514 in simple manner in order to match the current capacity of the motor-generator 192.

In order to keep the parasitic inductance of the positive electrode conductor plate 702 and the negative electrode conductor plate 704 that make up the DC side conductor plate 700 low, it is desirable to reduce the gap between them as much as possible. For example, if a portion that is made as curved is present upon the DC side conductor plate 700 for accommodating connection wiring to the power modules 300 and the capacitor module 500, then a larger gap will be created at this portion that is made as curved than at the flat plate portion, so that the parasitic inductance will become undesirably large.

Thus, according to this embodiment, the positive electrode side connection portions 314a and the negative electrode side connection portions 316a of the power modules 300 and the negative electrode side capacitor terminals 504c and the negative electrode side connection portions 504b of the capacitor module, are built so as to all be arranged upon approximately the same planar surface. Since due to this it is possible to use such a DC side conductor plate 700 of a flat plate shape, accordingly it is possible to make the gap between the positive electrode conductor plate 702 and the negative electrode conductor plate 704 small, so that it is possible to reduce the parasitic inductance.

FIG. 15(a) shows an enlarged view of the connection region 380 of one of the power modules 300 and the DC side conductor plate 700 shown in FIG. 14 (refer to FIG. 14(a)).

As shown in FIG. 15(a), the negative electrode side connection portion 316a and the positive electrode side connection portion 314a are made so that the end portions of the DC positive electrode terminal 314 and the DC negative electrode terminal 316 are curved in opposite directions, and the negative electrode conductor plate 704 and the positive electrode conductor plate 702 of the laminated DC side conductor plate 700 are respectively connected to this negative electrode side connection portion 316a and this positive electrode side connection portion 314a.

Figure 15:
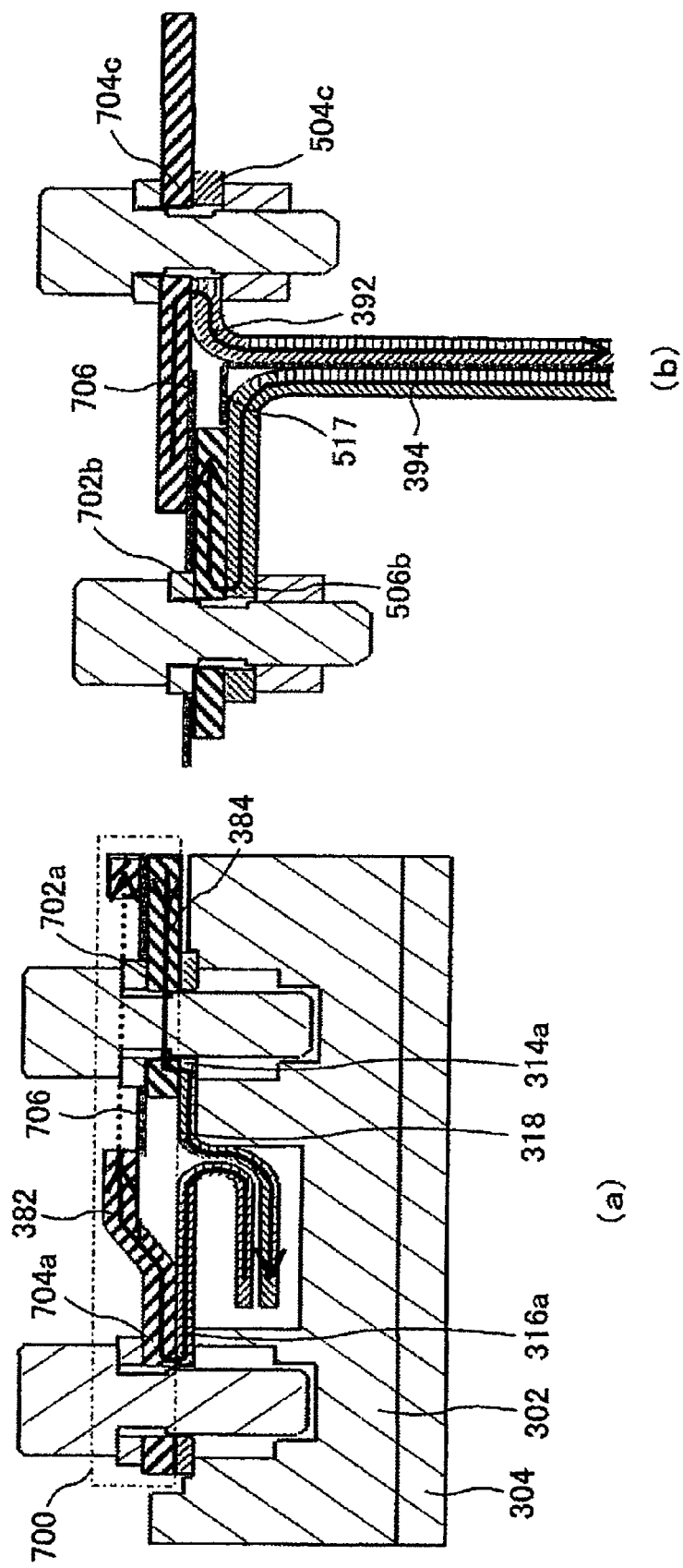
FIG. 15(a) is an enlarged view of a connection location 380 between one of the power modules 300 shown in FIG. 14 and the DC side conductor plate 700 (refer to FIG. 14(a))
FIG. 15(b) is an enlarged view of a connection location 390 on the DC side conductor plate 700 (refer to FIG. 14(a))

Due to this, a U-turning current is created between the connection portion 704a of the negative electrode conductor plate and the negative electrode side connection portion 316a, since the current on the negative electrode side that flows instantaneously when the IGBTs 328 and 330 are switched follows the current path 382 shown in FIG. 15. Accordingly it may be expected that the inductance will be reduced, since the magnetic flux generated around the connection portion 704a of the negative electrode conductor plate 704 and the magnetic flux generated around the negative electrode side connection portion 316a tend to cancel one another out.

On the other hand, the current in the connection portion 702a of the positive electrode conductor plate follows a current path 384 as shown in FIG. 15. Since the negative electrode conductor plate 704 is disposed above this connection portion 702a of the positive electrode conductor plate, accordingly the current direction in the connection portion 702a of the positive, electrode conductor plate and the current direction in the negative electrode conductor plate 704 are opposite, so that the magnetic fluxes generated by these two currents tend to cancel one another out. As a result, it is possible to reduce the parasitic inductance of the connection portion 702a of the positive electrode conductor plate.

Moreover, as shown in FIG. 15(a), the insulating paper 318 and the insulating sheet 706 are arranged so as to have regions that overlap in the vertical direction. Furthermore, when the DC side conductor plate 700 is fixed by screws or the like to the negative electrode side connection portion 316a and the positive electrode side connection portion 314a, then the insulating paper 318 and the insulating sheet 706 are arranged so as to have regions in which they are not sandwiched between the DC side conductor plate 700 and the positive electrode side connection portion 314a, in other words regions in which they are not subjected to any compressive stress. Due to this, it is possible to ensure the insulation between the positive electrode and the negative electrode in the connection portion; in concrete terms, it is possible to ensure the insulation between the positive electrode side connection portion 314a and the negative electrode conductor plate 704.

FIG. 15(b) shows an enlarged view of the connection region 390 of the DC side conductor plate 700 (refer to FIG. 14(a)).

As shown in FIG. 15(b), the positive electrode side capacitor terminal 506b and the negative electrode side capacitor terminal 504c of the capacitor module 500 are made so as to be bent in mutually opposite directions, and the positive electrode conductor plate 702 and the negative electrode conductor plate 704 of the DC side conductor plate 700 are connected to their respective upper surfaces.

Due to this, a U-turning current is created between the connection portion 704c of the negative electrode conductor plate 704 and the negative electrode side capacitor terminal 504c of the capacitor module 500, since the current on the negative electrode side that flows instantaneously when the IGBTs 328 and 330 are switched follows the current path 392 shown in FIG. 15(b). Accordingly it may be expected that the inductance will be reduced, since the magnetic flux generated around the connection portion 704a of the negative electrode conductor plate 704 and the magnetic flux generated around the negative electrode side capacitor terminal 504c tend to cancel one another out.

In a similar manner, the current in the positive electrode side that flows instantaneously when the IGBTs 328 and 330 are switched follows a current path 394 as shown in FIG. 15(b). In other words, a U-turning current is created between the connection portion 702b of the positive electrode conductor plate and the positive electrode side capacitor terminal 506b of the capacitor module 500. Accordingly, the magnetic flux that is generated around the connection portion 702b of the positive electrode conductor plate 702 and the magnetic flux that is generated around the positive electrode side capacitor terminal 506b tend to cancel one another out, so that it is possible to contemplate reduction of the inductance.

Moreover, as shown in FIG. 15(b), the insulating sheet 517 and the insulating sheet 706 are arranged so as to have regions that overlap in the vertical direction. Furthermore, when the DC side conductor plate 700 is fixed by screws or the like to the positive electrode side capacitor terminal 506b and the negative electrode side capacitor terminal 504c, the insulating sheet 517 and the insulating sheet 706 are arranged so as to have regions in which they are not sandwiched between the DC side conductor plate 700 and the positive electrode side capacitor terminal 506b, in other words regions in which they are not subjected to any compressive stress. Due to this, it is possible to ensure the insulation between the positive electrode and the negative electrode in the connection portion; in concrete terms, it is possible to ensure the insulation between the positive electrode side capacitor terminal 506b and the negative electrode conductor plate 704.

The influence that the parasitic inductance described above exerts upon switching will now be explained in the following.

Figure 16:
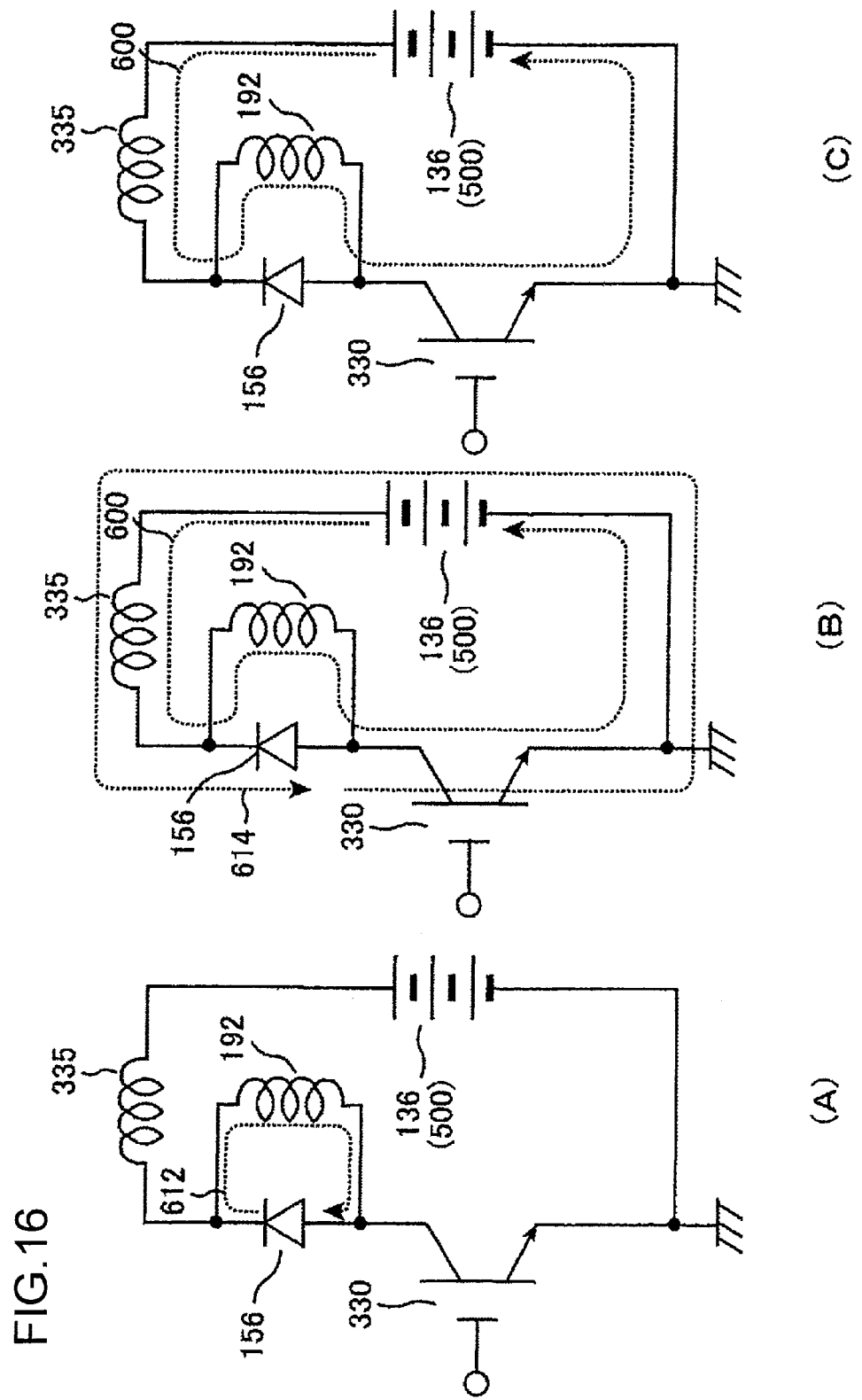
FIG. 16 is a figure showing circuits in which current flows when an IGBT 330 of a lower arm is turned ON (i.e. goes to continuous), at each of time points (A), (B), and (C)

The current that flows during switching to turn a lower arm ON will now be explained using FIGS. 16 and 17. FIG. 16 is a figure that shows a portion of the upper and lower arm series circuit of a power module 300, and the circuits through that current flows when a lower arm IGBT 330 is turned ON are shown by (A), (B), and (C) in order of time.

In FIG. 16, in this upper and lower arm series circuit, a diode 156 of the upper arm and an IGBT 330 of the lower arm are shown, while 192 represents the inductance of the motor-generator 192 of FIG. 2. And the parasitic inductance component 335 represents the parasitic inductances of the power module 300, the DC side conductor plate 700, and the capacitor module 500 taken all together. While the battery 136 is shown in FIG. 16 in order to make the supply of power easy to understand, actually this is the capacitor module 500 that has been charged up by the battery 500.

In normal operation, one or the other set of the upper arm IGBTs 328 and the lower arm IGBTs 330 of the upper and lower arm series circuit 150 are continuous, while the other set of IGBTs are discontinuous. In other words, it never happens that the upper and lower arm IGBTs are continuous at the same time. In FIG. 16, in order to explain the case when the lower arm is turned ON, the upper arm IGBTs and the lower arm diodes are omitted.

The state of FIG. 16(A) shows the return state (when current is being returned) in which the lower arm IGBT 330 is in the non-continuous state (i.e. OFF), and the current of the motor-generator 192 passes through the diode 156 and returns to the motor-generator for a second time. On the other hand, FIG. 16(B) shows a state (during recovery) in which the current of the diode 156 flows in the opposite direction to the direction during current return shown in FIG. 16(A). And FIG. 16(C) shows a state in which the current flowing in the diode 156 is intercepted (i.e. is OFF).

When, from the state of FIG. 16(A), the lower arm IGBT 330 goes continuous (i.e. is turned ON), a current starts to flow in the IGBT 330, and the current flowing in the motor-generator 192 does not change, while the current flowing in the diode 156 gradually diminishes. Thereafter, when the current flowing in the IGBT 330 has become equal to the current flowing in the motor-generator 192 (i.e. at the start of (B), at t1 in FIG. 17), the current of the diode 156 becomes zero, and a voltage starts to be applied to the diode in the opposite direction (i.e. in the direction from its cathode to its anode).

However, since holes or electron carriers accumulate within the semiconductor of the diode 156, when this voltage in the opposite direction is applied (reverse bias), current starts to flow in the opposite direction (from the cathode to the anode). As shown in FIG. 16(B), a through current 614 flows in the opposite direction to the direction during current return (A). As a result, a current greater than or equal to that has flowed in the motor-generator 192 flows in the IGBT 330, (the interval (B) in FIG. 17), and flows through the parasitic inductance component 335.

Subsequently, the carriers accumulated in the diode 156 disappear, and the diode goes to discontinuous (i.e. goes OFF). At this time the carriers disappear abruptly, so that the current that flows in the diode becomes small abruptly. Due to this, a spike voltage equal to the product of the L of the parasitic inductance component 335 and the abrupt change di/dt of the current is generated across the two ends of the diode 156. When this becomes great, apart from exceeding the withstand voltage of the diode 156 to the extent of destroying it, the similar voltage that is also applied to the IGBT connected in parallel with the diode may destroy it. Due to this, it is very important to reduce the parasitic inductance component 335 in order to reduce this spike voltage.

Figure 17:
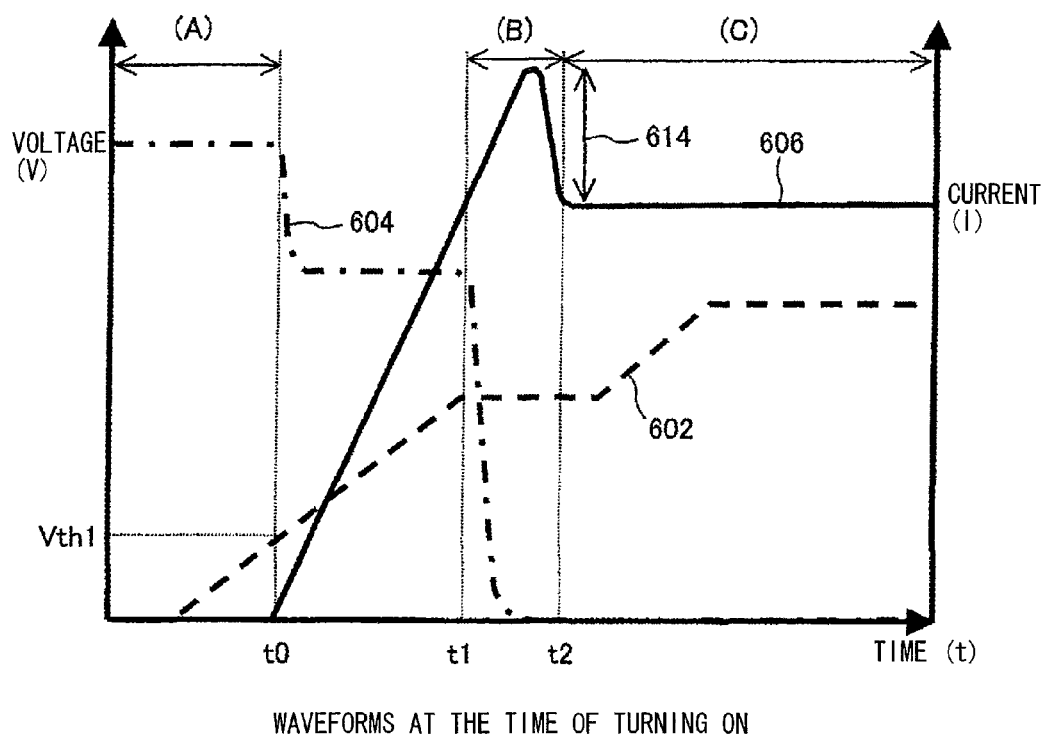
FIG. 17 is a figure showing the variation of waveforms of the collector current 606 (the solid line), the collector voltage 604 (the single dotted broken line), and the gate voltage 602 (the broken line) of an IGBT 330 of a lower arm, according to time when the IGBT 330 goes from the non-continuous state (OFF) to the continuous state (ON)

FIG. 17 shows the waveforms of the changes over time of the collector current 606 (the solid line), the collector voltage 604 (the dash-dotted line), and the gate voltage 602 (the dashed line) of the lower arm IGBT 330, when that IGBT 330 goes from the non-continuous state (i.e. OFF) to the continuous state (i.e. ON). The intervals (A), (B), and (C) in FIG. 17 correspond respectively to (A), (B), and (C) in FIG. 16. Here, the waveform of the gate voltage is displayed as magnified.

When, from the state in the interval (A) of FIG. 17, a drive voltage is applied to the gate of the IGBT 330, the capacitance between the gate and the emitter and the capacitance between the gate and the collector are charged, and the gate voltage 602 (shown by the dashed line) of this lower arm IGBT 330 increases. And the return current of the motor-generator 192 flows to the upper arm diode 156. And the collector current 606 of the lower arm IGBT 330 starts to flow from the time point t0 at which the gate voltage 602 exceeds the threshold voltage value Vth1 at which the IGBT 330 starts to be continuous (i.e. ON). Along with this, the return current of the upper arm diode 156 starts to diminish.

At this time, the collector voltage 604 of the IGBT 330 (shown by the dash-dotted line) decreases with generation of the voltage surge in the reverse direction that is the product of the current change due to increase of the collector current of the IGBT (the solid line) and the parasitic inductance component 335. During this period, the gate voltage of the IGBT 330 (the dashed line) continues to increase until the current of the IGBT 30 reaches the current of the motor-generator 192.

Next after the time point t1, when the current in the IGBT 330 reaches the current that flows in the motor-generator 192 and the return current flowing in the diode 156 becomes zero, the voltage of the IGBT 330 starts to drop, and a reverse bias voltage starts to be applied to the diode 156. When this happens, due to the carriers accumulated in the diode 156, the through current 614 flows in the opposite direction to the return current, and the system goes into the state of the interval (B) of FIG. 17. At this time, due to dropping of the collector voltage 604 of the IGBT 330 (the dash-dotted line), and since a discharge current flows due to the charge accumulated in the capacitance C between the gate and the collector, accordingly the gate voltage 602 of the IGBT (the broken line) is clamped, and the rising of the gate voltage temporarily pauses.

The current that flows in the IGBT 330 is the current that flows in the motor-generator 192 with the through current 614 superimposed. Due to this, the collector current 606 becomes a peak current larger than the current 600 that flows in the motor-generator 192. On the other hand, the through current 614 disappears when the accumulated carriers in the diode 156 become exhausted, and then the collector current 606 of the IGBT 330 becomes equal to the current 600 flowing in the motor-generator 192.

For the lower arm IGBT 330, the voltage between the collector and the emitter becomes higher during the time period from t0 to t2, and, since the state is established in which the collector current 606 flows, an amount of heat generation (turning ON loss) that may be expressed as the product of the current and the voltage is generated in the IGBT 330.

On the other hand, at the abrupt attenuation of the through current 614 for the upper arm due to the disappearance of the accumulated carriers, a spike voltage is generated in the diode 156, determined by the product of the change over time di/dt of the current and the parasitic inductance component 335, i.e. V=L·di/dt. This voltage is also applied to the upper arm IGBT.

As a method of reducing the heat generated in the IGBT 330 (i.e. the turning ON loss), the switching time period may be shortened, in other words switching may be performed with fast di/dt, within the range in which the spike voltage does not exceed the withstand voltages of the diode and the IGBT. By reducing the parasitic inductance L while not exceeding the withstand voltages of the IGBT and the diode, it is possible to perform switching with fast di/dt and to reduce the turning ON loss. When it is possible to reduce the turning ON loss, then IGBTs and diodes that are small in area may be used since the element temperature does not rise greatly, so that it is possible to produce a semiconductor module and a power conversion device that are compact and low in cost, due to this reduction of the element area.

In the above explanation, as one example of current flow in the upper and lower arms, the turning ON of an IGBT was described. In the method for controlling the inverter circuit 144, or in the control state, a state also occurs in which through current flow is present in the upper and lower arms when the IGBTs are made discontinuous (i.e. are turned OFF). Next, the operation of changing an IGBT to discontinuous (i.e. of turning it OFF) will be described.

Figure 18:
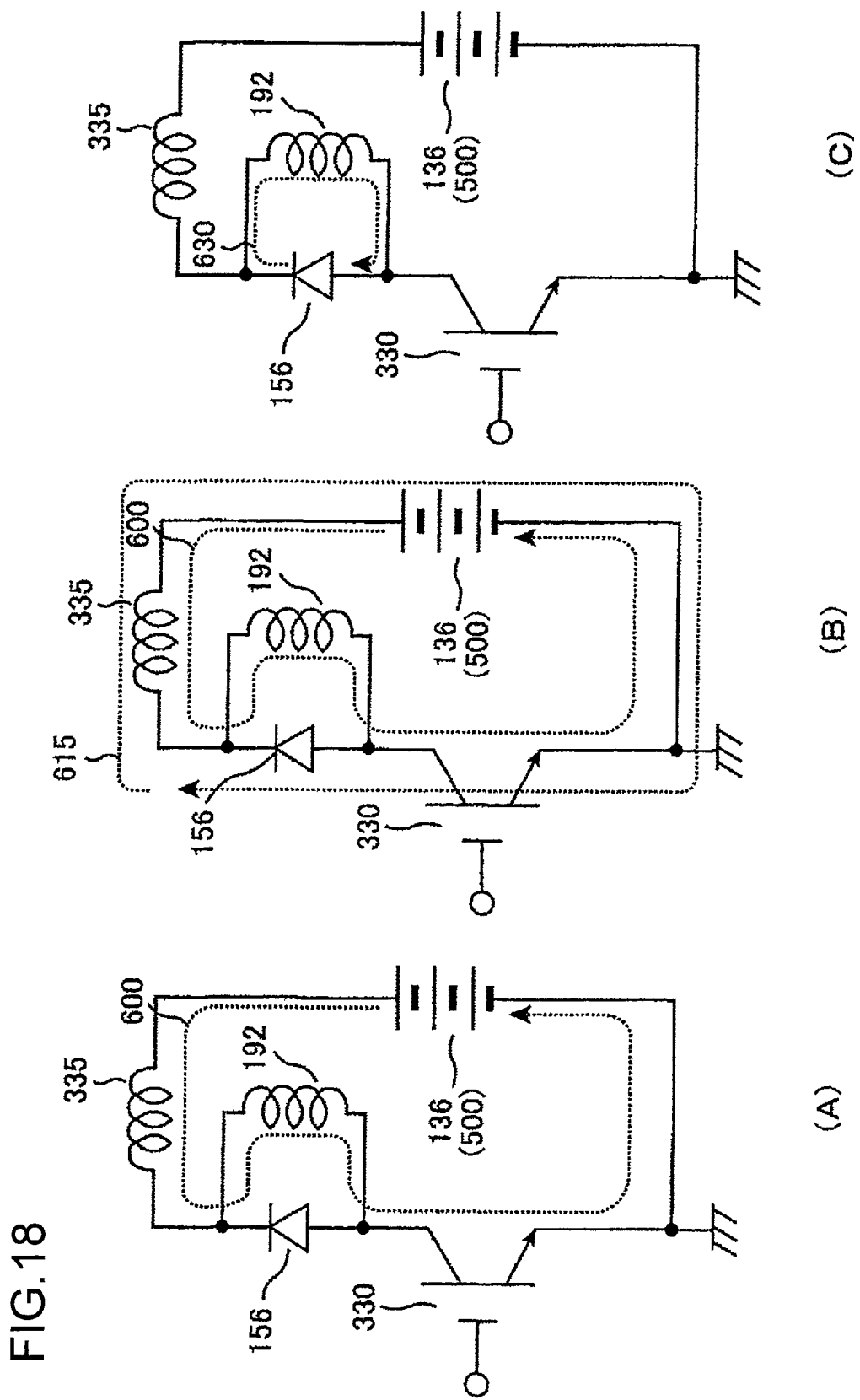
FIG. 18 is a figure showing circuits in which current flows when an IGBT 330 of a lower arm is turned OFF (i.e. is discontinuous), at each of times (A), (B), and (C)
Figure 19:
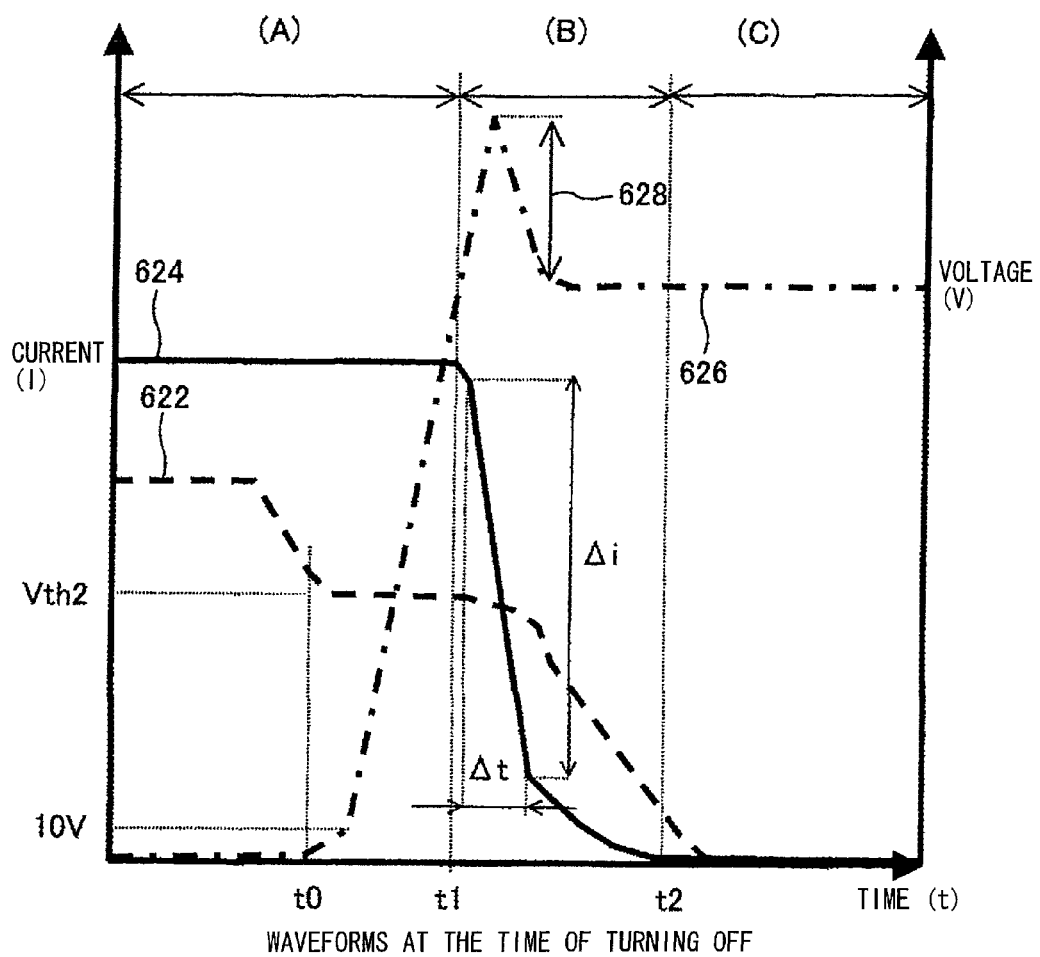
FIG. 19 is a figure showing the waveforms of the gate voltage 622, the collector current 624, and the collector voltage 626 of an IGBT 330 of a lower arm, when the IGBT is turned OFF (i.e. is discontinuous)

FIG. 18 is a figure showing a portion of an upper and lower arm series circuit of a power module 300, and the circuits through which current flows when a lower arm IGBT 330 is turned OFF (i.e. becomes discontinuous) are shown by (A), (B), and (C) in order of time. And FIG. 19 shows the waveforms of the gate voltage 622, the collector current 624, and the collector voltage 626 when the lower arm IGBT 330 is turned OFF (i.e. becomes discontinuous), with the intervals (A), (B), and (C) in FIG. 17 corresponding respectively to (A), (B), and (C) in FIG. 18.

(A) in FIG. 8 shows the continuous state before the lower arm IGBT goes to discontinuous, while (B) shows the current that flows while the circuit is becoming discontinuous and (C) shows the current that flows after the circuit has become discontinuous.

At (A) in FIG. 18, the lower arm IGBT 330 is in the continuous state and a current 600 flows from the battery 136 via the parasitic inductance component 335 to the inductance of the motor-generator 192. And (B) in FIG. 18 shows a process in which, in the state in which the current in the lower arm IGBT 330 is intercepted, the current that flows in the lower arm IGBT 330 gradually diminishes, and the reduced amount of the current flows through the diode 156 of the upper arm. In other words, to view the situation in an easily understandable manner, it may be considered that a through current 615 gradually flows in the opposite direction to the current 600 in the IGBT 330 in the forward direction.

The transition to discontinuous of the lower arm IGBT 330 is started by the charge that the driver circuit 174 has accumulated in the capacitance between the gate and the emitter of the lower arm IGBT being discharged via the resistance within the driver circuit 174 (i.e. gate resistance).

When discharge starts as shown in FIG. 19, the gate voltage 622 (shown by the broken line) decreases. And when the gate voltage 622 (the dashed line) drops below the threshold value Vth2, the collector voltage 626 (shown by the dash-dotted line) starts to rise. This collector voltage gently rises to around 10 V, and, since during this interval the capacitance between the gate and the collector is charged up, accordingly discharge of the charge accumulated in the electrostatic capacitance between the gate and the emitter temporarily pauses, and the decrease of the gate voltage 622 (the dashed line) also temporarily pauses. Thereafter, when the collector voltage becomes 10 V or above, since the capacitance between the gate and the collector abruptly becomes smaller and the charging current between the gate and the collector becomes smaller, accordingly discharge of the charge accumulated in the capacitance between the gate and the emitter starts again for a second time. And the collector voltage 626 (the dash-dotted line) starts to rise abruptly. When the collector voltage 626 (the dash-dotted line) reaches the battery voltage, the lower arm IGBT 330 becomes incapable of supplying the current of the motor-generator 192, and the collector current 624 (shown by the solid line) starts to decrease abruptly. Furthermore, the interval (B) commences, in which the return current in the upper arm diode 156 starts to flow. At this time, a spike voltage (L·di/dt) 628 is generated in the lower arm IGBT that is the product of the change over time di/dt of the collector current (I) 624 (the solid line), during decrease, and the parasitic inductance component (L). This spike voltage 628 is superimposed upon the battery voltage that has been reached by the lower arm IGBT 330, so that a voltage larger than the battery voltage is applied to the lower arm IGBT 330.

Subsequently, the gate voltage 622 decreases with a time constant determined by the capacitance between the gate and the emitter and the drive circuit discharge resistance. On the other hand, the lower arm IGBT no longer under control by the gate voltage, and the collector current 624 of the lower arm IGBT (the solid line) decreases along with disappearance of the carriers within the IGBT.

When the collector current 624 of the lower arm IGBT becomes zero, the state during the interval (C) is established, and only the return current between the motor-generator 192 and the diode 156 of the upper arm flows.

If the spike voltage 628 during the interval (B) of FIG. 19 exceeds the withstand voltage even once, then the IGBT and/or the diode will be destroyed, and it will no longer be possible to drive the motor-generator. Furthermore, if the spike voltage is large, the current that flows in the parasitic capacitance of the casing and so on becomes great, and this not only invites erroneous operation of the power conversion device itself, but also may constitute a cause for the occurrence of erroneous operation of some device external to the power conversion device. Due to this, the IGBTs are designed and controlled so as to have a certain margin over the spike voltage 628 that is generated, in order to ensure that the withstand voltages of the IGBT and the diode are not exceeded, and in order to prevent noise and erroneous operation.

Since the spike voltage is determined by the change over time di/dt of the collector current 624 (the solid line) (I) and the parasitic inductance component (L) 335 (i.e. is equal to L·di/dt), accordingly the only way to reduce the spike voltage 628 during the interval (B) of FIG. 19, is to reduce di/dt (Δi/Δt in FIG. 19), or to reduce L.

In order to reduce di/dt, it is effective to increase the gate resistance of the drive circuit that determines the discharge time constant for the capacitance between the gate and the emitter, so that the switching is performed more slowly, in other words so that the time period Δt becomes lengthened to Δt+T. However, if the switching period is lengthened in this way, then the heat generated in the IGBTs during switching becomes great, i.e. the heat (the switching loss) that is generated as determined by the product of the current and the voltage during the interval in which both the collector current and the collector voltage of the IGBTs are non-zero (i.e. the interval from t0 to t2 in FIG. 19) is increased. In order to satisfy the limit upon temperature during use of the IGBTs, this implies that the area of the IGBT elements becomes large, and accordingly the cost becomes great because the amount of silicon used increases, so that the power module also becomes large, the number of components is increased, and it becomes impossible to manufacture a compact power conversion device at low cost.

Furthermore while, in the prior art, it has also been possible to reduce the amount of heat generated per unit time by decreasing the number of times the IGBTs are switched per unit time (i.e. the carrier frequency), if this is done, it becomes difficult to obtain a fine control response during high speed rotation of the motor-generator.

Due to this, in order to reduce the spike voltage 628, rather than reducing di/dt, it is better to reduce the parasitic inductance component (L) 335. As will be understood from the path of the current that causes this spike voltage, in other words from the path of the through current 614 in FIG. 16(B) or from the path of the through current 615 in FIG. 18(B), this parasitic inductance component (L) 335 is a summation of all of the parasitic inductances of the circuitry from the power supply (the capacitor module 500) to the upper and lower arm series circuit of the power module.

In other words, it is necessary to construct the power conversion device while reducing the total of the parasitic inductances internal to the power module 300, the parasitic inductance of the DC side conductor plate 700, and the parasitic inductance of the capacitor module 500, and also reducing the parasitic inductances that occur in the portions connecting those elements; and, in this embodiment, a construction is disclosed that implements overall low, from the internal circuit board layout of the power module, through the power module terminals, the connection portion between the power module and the DC bus bar, the DC bus bar itself, the connection portion between the DC bus bar and the capacitor module, and the capacitor module itself.

According to the construction of this embodiment, it is easily possible to implement an inductance of 30 nanohenries or less, and moreover by optimizing the dimensions it is possible to reach 20 nanohenries (nH). Moreover, at a carrier frequency of 10 kHz or more, and with an cutting off time interval (Δt in FIG. 19) of 0.1 microseconds (μs) or less for a transmitted current of 500 amperes (A) (Δi in FIG. 19), so that the current change speed is 5 gigaamperes/sec (GA/s) or greater, it is possible to obtain (L×di/dt)=20 nH×5 GA/s=100V as the spike voltage. In the case of a power conversion device 200 of this type whose loss (generation of heat) is low, cooling water from the engine may be used as the cooling water.

Figure 20:
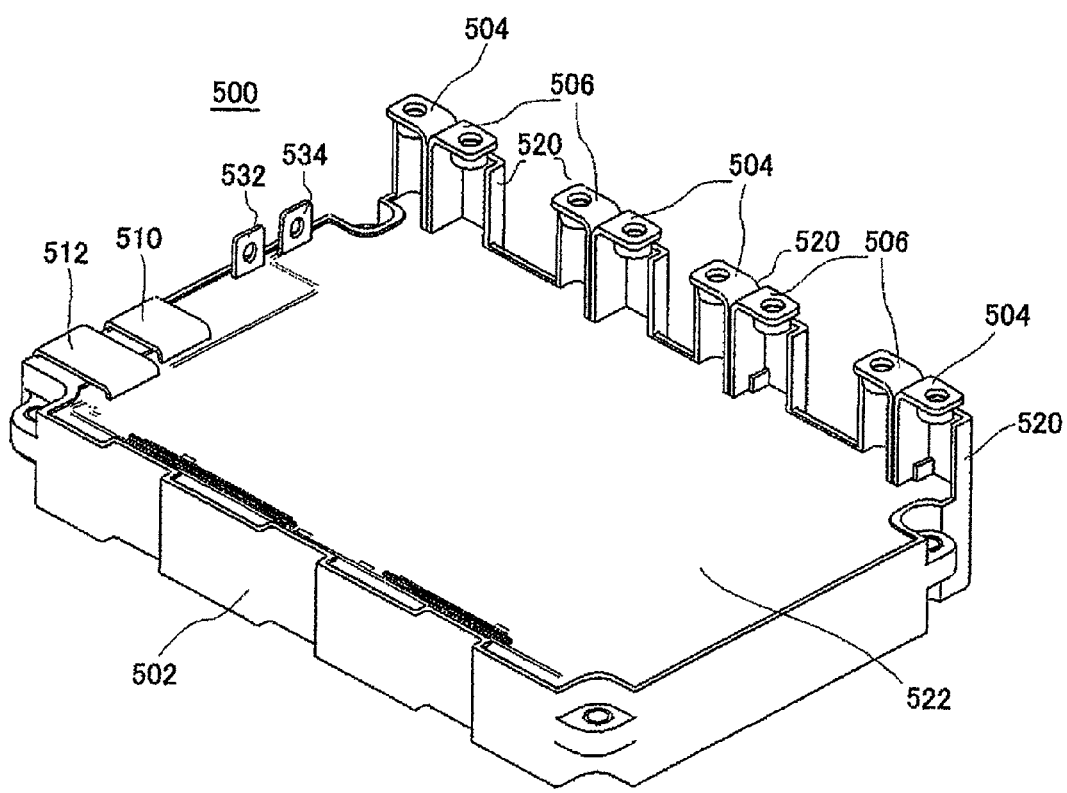
FIG. 20 is a perspective view showing the external appearance and structure of a capacitor module according to this embodiment.

The detailed construction of the capacitor module 500 of this embodiment will now be explained in the following with reference to FIGS. 20 through 22. FIG. 20 is a perspective view showing the external appearance and structure of the capacitor module 500 according to this embodiment. FIG. 21 is a perspective view showing the situation before a filler material 522 such as resin or the like is charged into the interior of the capacitor module 500 shown in FIG. 20, for easier understanding thereof. And FIG. 22 is a figure showing this construction of the capacitor module 500 in more detail, and particularly showing a construction according to which capacitor cells 514 are fixed to a laminated conductor.

In FIGS. 20 through 22, 500 is a capacitor module, 502 is the capacitor case, 504 is the negative electrode side capacitor terminal, 506 is the positive electrode side capacitor terminal, 510 is a DC (battery) negative electrode side connection terminal portion, 512 is a DC (battery) positive electrode side connection terminal portion, 532 is a positive electrode terminal for auxiliary machinery, 534 is a negative electrode terminal for auxiliary machinery, and 514 is a capacitor cell.

Figure 22:
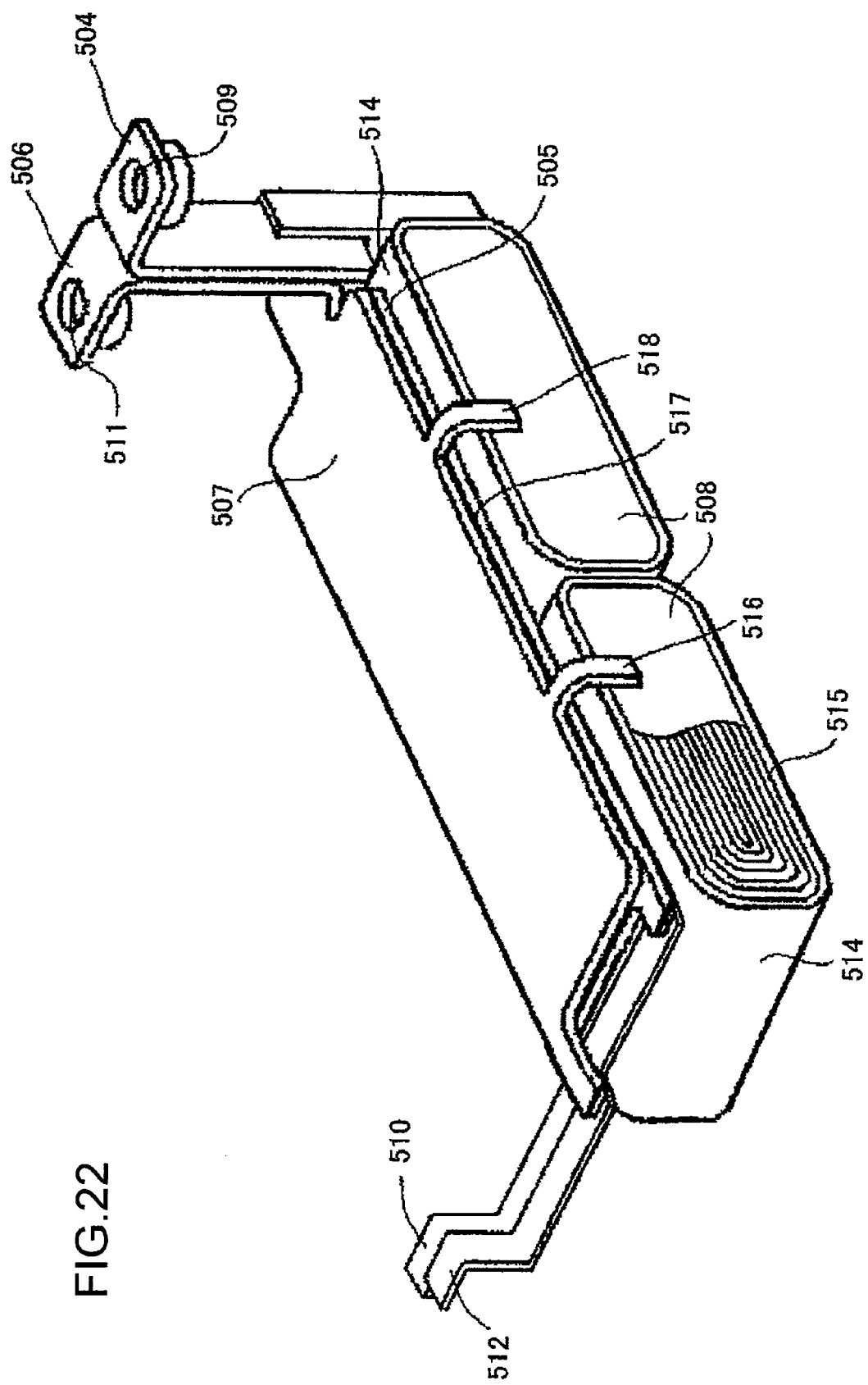
FIG. 22 is a figure showing the construction of the capacitor module 500 in greater detail, and particularly showing how capacitor cells 514 are fixed to a laminated conductor.

As shown in FIGS. 21 and 22, a plurality of laminated conductors each consisting of a negative electrode conductor plate 505 and a positive electrode conductor plate 507 (in this embodiment four thereof) are electrically connected in parallel to a DC (battery) negative electrode side connection terminal portion 510 and a DC (battery) positive electrode side connection terminal portion 512. A plurality of terminals 516 and terminals 518 are provided to the negative electrode conductor plate 505 and the positive electrode conductor plate 507, for respective connection in parallel to the positive electrodes and the negative electrodes of the plurality of capacitor cells 514.

These capacitor cells 514 are electrical storage structural units that constitute the units of the capacitor module, and each of them includes a film capacitor 515 in which two films are wound laminated together, upon one side of each film is evaporated a metal layer of aluminum or the like, with one of these two metallic layers being a positive electrode and the other being a negative electrode. The both axial ends of the wound around films respectively form a positive electrode and a negative electrode of the capacitor cell, in which the axial ends are then sprayed with an electrically conductive material 508 such as tin or the like, and thus a capacitor cell is fabricated.

As shown in FIG. 22, the negative electrode conductor plate 505 and the positive electrode conductor plate 507 are made as thin wide plate shaped conductors, which are laminated together with an insulating sheet 517 between them. The parasitic inductance is reduced as a result. Terminals 516 and 518 are provided at a side portion of this laminated conductor for connection to the electrically conductive material 508 of the capacitor cells. These terminals 516 and 518 are electrically connected to the electrically conductive material 508 of two of the capacitor cells 514 by soldering or welding. In order to make it easy to use the soldering device or the welding machine, and in order to make testing easy, an arrangement for the capacitor cells and a construction for the conductor are employed in which the connection surfaces are located on the outside, and in which, as shown in the figure, two of the capacitor cells are built as a unit so as to constitute a single capacitor cell group. By manufacturing this type of cell group, it becomes possible to increase or decrease the number of cells according to the capacitance desired for the capacitor in a simple manner, so that this construction is well adapted to mass production. It would also be acceptable to provide a plurality of the terminals 516 and 518, in order to reduce the parasitic inductance and also for dissipation of heat (as will be explained hereinafter).

Furthermore, an end portion of the thin plate shaped wide conductor assembled from the negative electrode conductor plate 505 and the positive electrode conductor plate 507 is bent, and is made as a negative electrode side capacitor terminal 504 and a positive electrode side capacitor terminal 506 for connection to the DC side conductor plate 700. Moreover, the other portion of the thin plate shaped wide conductor assembled from the negative electrode conductor plate 505 and the positive electrode conductor plate 507 is also bent, and is made as a DC negative electrode side connection terminal portion 510 and a DC positive electrode side connection terminal portion 512 for connection to the battery and to terminals that are to receive power.

As shown in FIG. 21, the capacitor module 500 includes a total of eight capacitor cells 514, with four cell groups of two cells being positioned in line side by side. As connection terminals to the exterior of the capacitor module 500, there are: four pairs of a negative electrode side capacitor terminal 504 and a positive electrode side capacitor terminal 506 for connection t the DC side conductor plate 700; the DC negative electrode side connection terminal portion 510 and the DC positive electrode side connection terminal portion 512 that receive electrical power from the battery; and a positive electrode terminal 532 and a negative electrode terminal 534 for auxiliary machinery that supply electricity to the power module of the inverter for auxiliary machinery. Opening portions 509 and 511 within which nuts are embedded are formed in the negative electrode side capacitor terminals 504 and in the positive electrode side capacitor terminals 506, so that they can be fixed with screws to the DC positive electrode terminals 316 and the DC negative electrode terminals 314 of the power modules 300.

The capacitor case 502 has a terminal cover 520, and, along with determining the positions of the terminals, this also provides insulation from the casing of the power conversion device. Moreover, partitions between the various cell groups are provided in the capacitor case 502, for positionally fixing the cell groups. While a material whose thermal conductivity is excellent is used for the capacitor case 502, for heat dissipation, it would also be acceptable to provide a structure in which a material whose thermal conductivity is good is embedded in these partitions between the capacitor cell groups.

This capacitor module 500 generates heat due to ripple current during switching, and due to the electrical resistances of the thin metallic layers that are evaporated upon the internal films of the capacitor cells and the resistances of their internal conductors (their terminals). In order for these capacitor cells to be water resistant, the capacitor cells and the internal conductors (the terminals) are impregnated (molded) with resin in the capacitor case 502. Due to this, the capacitor cells and the internal conductors are in a state of being closely adhered to the capacitor case 502, so that, with this construction, the heat generated by the capacitor cells can easily be transmitted to the case. Furthermore, since with this construction the negative electrode conductor plates 505, the positive electrode conductor plates 507, the electrically conductive material 508 of the capacitor cells, and the terminals 516 and 518 are directly connected, accordingly the heat generated by the capacitor cells is directly transmitted to the negative electrode conductors and the positive electrode conductors, and, with this structure, via the wide conductors, this heat is easily transmitted to the molding resin. Due to this, as in FIG. 4, heat is satisfactorily transmitted from the capacitor case 502 to the lower casing lid portion 16, and from the lower casing lid portion 16 to the casing 12 and then to the cooling water flow path 19, so that good heat dissipation characteristics can be ensured.

It should be understood that, if as in this embodiment the interior of the capacitor module 500 is separated into a number of capacitor cells 514, then the DC negative electrode side connection terminal portions 510 and the DC positive electrode side connection terminal portions 512 for connection to the battery 136 could also be provided on the side of the DC side conductor plate 700. Since in this way the conductors that are extended for connection to those DC negative electrode side connection terminal portions 510 and so on for each separated one of the capacitor cells 514 would become unnecessary, accordingly it would be possible to reduce the number of components and to enhance the productivity during manufacture.

Furthermore while, in this embodiment, the negative electrode conductor plates 505 and the positive electrode conductor plates 507 have a structure in which they are arranged independently side by side as a row of four, as shown in FIG. 22, it would also be acceptable to arrange to provide a structure in which this row of four negative electrode conductor plates 505 and positive electrode conductor plates 507 are made as an integrated wide conductor plate, and in which all of the capacitor cells 514 are connected to this wide conductor plate. By doing this, along with it being possible to reduce the number of components and to enhance the productivity during manufacture, it is also possible to employ the electrostatic capacity of all of the capacitor cells 514 approximately equally, so that it is possible to extend the component life of the entire capacitor module 500. Moreover, by employing such a wide conductor plate, it is also possible to reduce the parasitic inductance.

The content of the disclosure of the following application, upon which priority right is claimed, is hereby incorporated herein by reference:

Japanese Patent Application 2008-202603 (applied on 6 Aug. 2008).

The invention claimed is:

1. A semiconductor device that uses at least a single power semiconductor element that, by switching, can either short circuit together or disconnect the electrical potentials at the two ends of the power semiconductor element, and comprising:
   a power semiconductor element of a thin plate shape equipped with electrodes on both sides;
   an insulating board upon one surface of which at least a first wiring pattern, a second wiring pattern, and a third wiring pattern are formed; and
   a metallic base that is adhered to the surface of the insulating board opposite to its surface upon which the wiring patterns are disposed;
   and wherein:
   an electrode of one side of the power semiconductor element is electrically connected upon the first wiring pattern of the insulating board, and an electrode of other side of the power semiconductor element is connected to a second wiring pattern and a third wiring pattern;
   the first wiring pattern is approximately shaped as a letter-T, and the second and third wiring patterns are disposed on both sides of a vertical bar of the approximate letter-T shape of the first wiring pattern;
   a first current path of the first wiring pattern, the power semiconductor element, and the second wiring pattern, and a second current path of the first wiring pattern, the power semiconductor element, and the third wiring pattern, constitute two current paths that turn around in letter-U shapes; and
   two eddy currents that are induced in the metallic base due to current flowing when the power semiconductor element is switched are created so as to eddy in mutually opposite directions.

2. The semiconductor device according to claim 1, further comprising a first circuit and a second circuit that comprise insulating boards bearing the wiring patterns; and wherein the first circuit and the second circuit constitute a series circuit, and an electrical potential at both ends of the series circuit is outputted from a connection point between the first circuit and the second circuit due to switching of the power semiconductor element.

* * * * *